(12) United States Patent
Suga et al.

(10) Patent No.: US 7,928,380 B2
(45) Date of Patent: Apr. 19, 2011

(54) SAMPLE HOLDER, METHOD FOR OBSERVATION AND INSPECTION, AND APPARATUS FOR OBSERVATION AND INSPECTION

(75) Inventors: Mitsuo Suga, Saitama (JP); Hidetoshi Nishiyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 280 days.

(21) Appl. No.: 12/342,897

(22) Filed: Dec. 23, 2008

(65) Prior Publication Data

US 2009/0166536 A1 Jul. 2, 2009

(30) Foreign Application Priority Data

Dec. 26, 2007 (JP) ................................. 2007-333483

(51) Int. Cl.
*G01N 23/02* (2006.01)
(52) U.S. Cl. .......................... 250/307; 250/306; 250/311
(58) Field of Classification Search .................... 250/307
See application file for complete search history.

(56) References Cited

U.S. PATENT DOCUMENTS

| 3,916,200 A | * | 10/1975 | Sparks et al. | ................. | 250/389 |
| 7,745,785 B2 | * | 6/2010 | Nishiyama | .................... | 250/311 |

FOREIGN PATENT DOCUMENTS

| JP | 47-24961 A | 10/1972 |
| JP | 6-318445 A | 11/1994 |
| JP | 2007-292702 A | 11/2007 |
| JP | 2007-294365 A | 11/2007 |

* cited by examiner

*Primary Examiner* — Phillip A Johnston
(74) *Attorney, Agent, or Firm* — The Webb Law Firm

(57) ABSTRACT

A sample holder used in SEM (scanning electron microscopy) or TEM (transmission electron microscopy) permitting observation and inspection at higher resolution. The holder has a frame-like member provided with an opening that is covered with a film. The film has a first surface on which a sample is held. The thickness D of the film and the length L of the portion of the film providing a cover over the opening in the frame-like member satisfy a relationship given by L/D <200,000.

25 Claims, 32 Drawing Sheets

FIG. 3
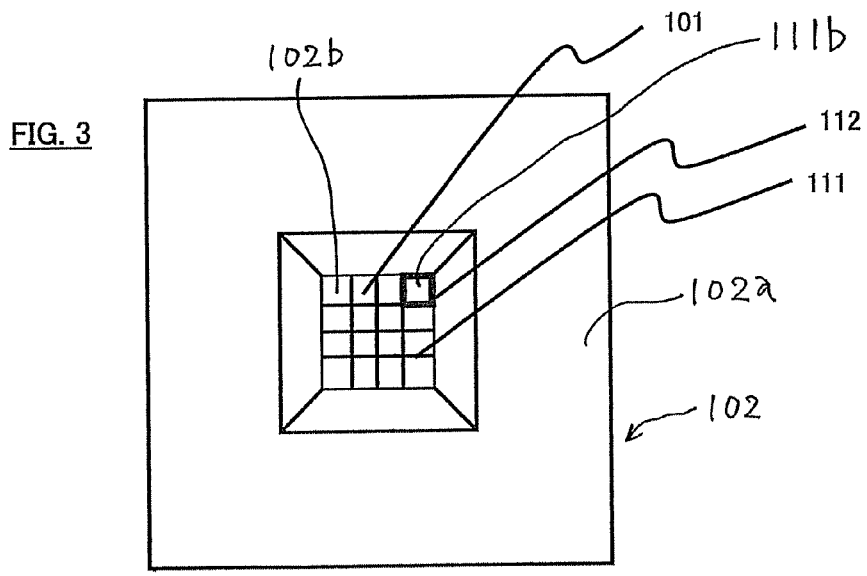
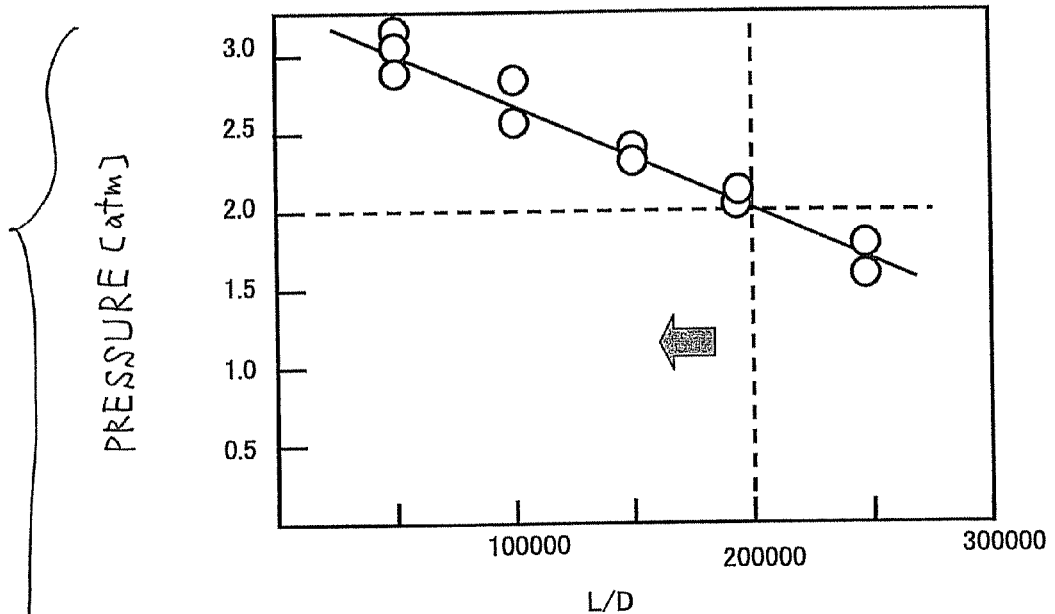
L/D < 200000
D = 0.001 um -> 200 um (50 um)
D = 0.01 um -> 2000 um (one side 500um)
D = 0.02 um -> 4000 um (800 um)
D = 100 um -> 20000 um (5000um)
FIG. 4

SAMPLE HOLDER, METHOD FOR OBSERVATION AND INSPECTION, AND APPARATUS FOR OBSERVATION AND INSPECTION

BACKGROUND OF THE INVENTION

1. Field of the Invention

The present invention relates to a sample holder permitting a sample to be observed and inspected using an electron beam or ion beam at high resolution in a case where the sample contains moisture or another liquid component. The present invention also relates to a method of observation and inspection using the sample holder. Furthermore, the present invention relates to an observation and inspection apparatus using the sample holder.

2. Description of Related Art

In a sample inspection apparatus having the configuration of a scanning electron microscope (SEM), a sample to be observed or inspected is placed in a sample chamber whose pressure is reduced by vacuum pumping. Under this condition, the sample is irradiated with an electron beam. As a result, secondary signals, such as backscattered electrons and secondary electrons, are emitted from the sample. These secondary signals are detected.

Similarly, in a sample observation apparatus or sample inspection apparatus having the configuration of a transmission electron microscope (TEM) or a scanning transmission electron microscope (STEM), a sample to be observed or inspected is placed in a sample chamber whose pressure is reduced by vacuum pumping. In TEM or STEM, the sample placed in a sample chamber is irradiated with an electron beam. The electron beam transmitted through the sample is detected.

In observing or inspecting a sample using such an apparatus, the sample is exposed to a reduced-pressure ambient within a sample chamber. Accordingly, when a sample containing moisture is to be observed or inspected, if the sample is placed intact within the specimen chamber that is a reduced-pressure ambient, water evaporates from the sample. This hinders observation or inspection of the sample under the condition where it contains moisture.

One example of a method of observing or inspecting a sample using SEM without exposing a sample to a reduced-pressure ambient in this way is shown in JP-A-2007-292702 (Application No. 2006-123711) and JP-A-2007-294365 (Application No. 2006-123712). In particular, the inside of a sample chamber is divided into an atmospheric-pressure ambient and a vacuum ambient using a film that transmits an electron beam but does not transmit gas. The sample is placed in the atmospheric-pressure ambient.

In this method, when an observation or inspection is performed, the sample placed in the atmospheric-pressure ambient is irradiated with an electron beam from the vacuum ambient, the beam impinging on the sample via the film. Backscattered electrons are produced from the irradiated sample. The backscattered electrons pass through the film and are detected by a backscattered electron detector mounted in the vacuum ambient. Consequently, a SEM image is obtained.

Another method is described in JP-A-47-24961 and JP-A-6-318445. In this method, a cell structure (sample holder) having a pair of films through which an electron beam is transmitted is placed in a TEM sample chamber. A sample is placed in the cell structure and irradiated with an electron beam. The electron beam transmitted through the sample is detected.

Where a conventional SEM sample holder as described in JP-A-2007-292702 (Application No. 2006-123711) and JP-A-2007-294365 (Application No. 2006-123712) is used, a thin film is used to observe or inspect a sample containing liquid. The thickness of the film is more than 10 nm and so it is difficult to use secondary electrons in imaging the sample. Consequently, backscattered electrons are used for imaging. Hence, it has been impossible to improve the resolution.

On the other hand, the conventional TEM sample holder has used carbon films and mesh. In this case, if the sample is placed in an environment that has been pumped down to some extent, good results will be obtained. However, it has been difficult to obtain 1 atm. pressure resistance. Furthermore, the sample holder is assembled fully manually, requiring much labor. Hence, it is impossible to cope with a large number of samples. Because the sample holder is assembled manually, it is difficult to reduce the spacing between the carbon films. As a result, there arises the problem that the resolution is deteriorated.

The problem common to SEM and TEM is that a sample of more than 1 milliliter is required when the sample is passed through a filter or a medicine is mixed into the sample.

SUMMARY OF THE INVENTION

A sample holder for use in SEM uses a thin film less than 10 nm thick and so secondary electrons can be detected. Consequently, imaging and inspection can be performed at higher resolution. A sample holder for use in TEM permits the distance between thin films to be reduced. Hence, high-resolution imaging and inspection are enabled. The common feature to SEM and TEM sample holders is that a sample containing liquid placed under atmospheric pressure can be observed or inspected after a small amount of the sample is passed through a filter or a medicine is mixed with the sample. In addition, a large number of sample holders can be fabricated because of use of MEMS or nanoimprint technology. It is an object of the present invention to provide such a sample holder. It is another object of the present invention to provide a method of observing or inspecting a sample using such a sample holder. It is a further object of the present invention to provide an apparatus for observing or inspecting a sample using such a sample holder.

A first sample holder, according to the present invention, has a frame-like member provided with an opening that is covered with a film. The film has a first surface on which a sample is held. The thickness D of the film and the length L of the outer periphery of the portion of the film that covers the opening in the frame-like member satisfy a relationship given by L/D <200,000.

A second sample holder, according to the present invention, has a frame-like member provided with an opening in which a lattice is formed. At least opening portions of the lattice are covered with a film. The film has a first surface on which a sample is held. The thickness D of the film and the length L of the outer periphery of the portion of the film that covers the opening portions in the lattice satisfy a relationship given by L/D <200,000.

A third sample holder, according to the present invention, has two sample holder components disposed opposite to each other such that a sample can be held between the holder components. Each of the sample holder components has the same structure as the first or second sample holder described above.

A fourth sample holder, according to the present invention, has a sample holder component having the same structure as the aforementioned first or second sample holder and a base disposed opposite to the sample holder component. A sample-holding space is formed between the sample holder component and the base. A channel for supplying a sample into the sample-holding space is formed. The sample can be supplied from the outside into the sample-holding space via the channel.

A fifth sample holder, according to the present invention, has two sample holder components disposed opposite to each other and a sample-holding space formed between the two holder components. Each of the holder components has the same structure as the aforementioned first or second sample holder. A channel for supplying a sample into the sample-holding space is formed. The sample can be supplied from the outside into the sample-holding space via the channel.

A sixth sample holder, according to the present invention, is characterized in that at least one of the aforementioned channel and sample-holding space has a filter structure that discriminates ingredients in the sample.

A first method of observing or inspecting a sample, in accordance with the present invention, consists of preparing one of the above-described first, second, and fourth sample holders, holding a sample on the first surface of the film, and irradiating the sample with a primary beam via a second surface of the film, thus observing or inspecting the sample.

A second method of observing or inspecting a sample, in accordance with the present invention, consists of preparing one of the above-described third and fifth sample holders, reducing the pressure outside the sample holder, holding the sample on the sample holder, and irradiating the sample with a primary beam under this condition, thus observing or inspecting the sample.

A first observation-and-inspection apparatus, according to the present invention, has support means for supporting one of the first, second, and fourth sample holders, primary beam irradiation means for irradiating a sample with a primary beam via the film of the sample holder, and signal detection means for detecting a secondary signal produced from the sample in response to the primary beam irradiation.

A second observation-and-inspection apparatus, according to the present invention, has support means for supporting one of the above-described first, second, and fourth sample holders, a vacuum chamber for reducing the pressure of an ambient in contact with the second surface of the film of the sample holder, primary beam irradiation means connected with the vacuum chamber and irradiating the sample held on the first surface of the film with the primary beam via the film, and signal detection means for detecting a secondary signal produced from the sample in response to the primary beam irradiation.

A third observation-and-inspection apparatus, according to the present invention, has support means for supporting one of the above-described third and fifth sample holders, primary beam irradiation means for irradiating the sample with a primary beam via the film of the sample holder, and signal detection means for detecting a secondary signal produced from the sample in response to the primary beam irradiation or a signal transmitted through the sample, thus obtaining information about the sample.

A fourth observation-and-inspection apparatus, according to the present invention, has support means for supporting one of the above-described third and fifth sample holders, a vacuum chamber for reducing the pressure of an ambient in contact with a side of the film of the sample holder not opposite to the sample, primary beam irradiation means connected with the vacuum chamber and irradiating the sample with a primary beam via the film, and signal detection means for detecting a secondary signal produced from the sample in response to the primary beam irradiation or a signal transmitted through the sample, thus obtaining information about the sample.

In the present invention, the opening in the frame-like member or the opening portions in the lattice are coated with the film. The relationship between the thickness D of the film and the length D of the outer periphery of the portion of the film that covers the opening in the film or the opening portions in the lattice is given by L/D <200,000. Therefore, if the film is thinned, the film can sufficiently withstand a pressure difference of greater than 1 atm. As a result, in observation or inspection using a primary beam such as in SEM or TEM, high resolution can be obtained.

Microlithography can be done by forming the film by an MEMS process including silicon nitride or by a nanoimprint process. Therefore, where the sample is passed through a filter or a medicine is mixed into the sample, the amount of sample can be reduced. Furthermore, sample holders can be mass produced by making use of the MEMS process or nanoimprint process.

BRIEF DESCRIPTION OF THE DRAWINGS

Further features and other objects and advantages of this invention will become clear from the following description in which:

FIG. 3 is a plan view of a sample holder having a lattice, according to Embodiment 1, showing the structure of the sample holder;

FIG. 4 is a graph showing the pressure resistance of the sample holder, according to Embodiment 1;

DESCRIPTION OF THE PREFERRED EMBODIMENTS

Embodiments of the present invention are hereinafter described with reference to the accompanying drawings.

Embodiment 1

Figure 1:
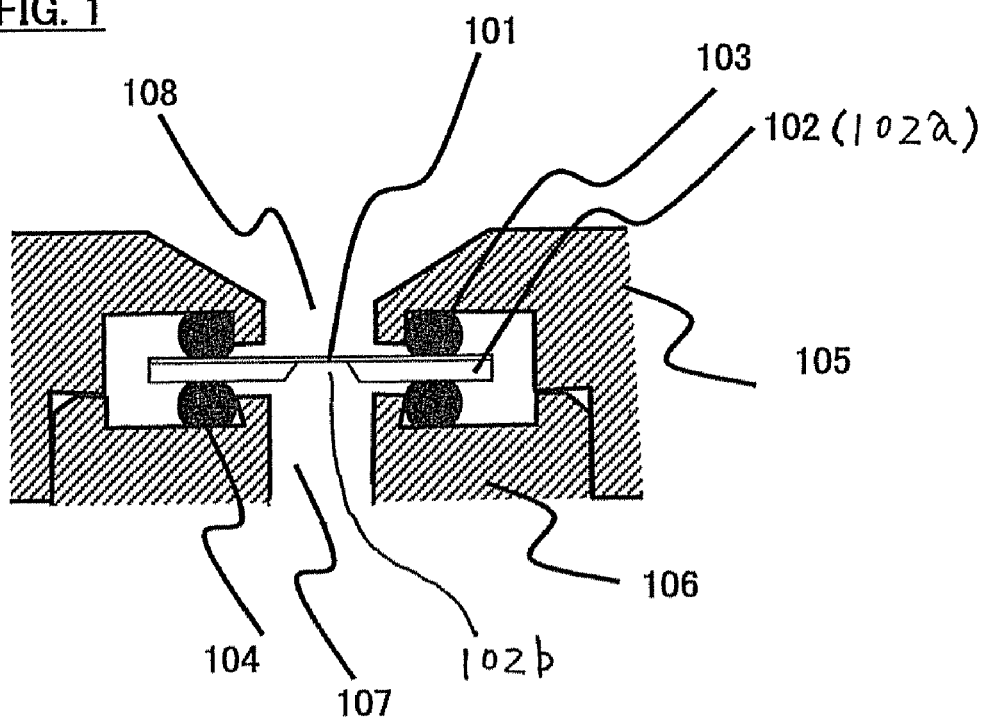
FIG. 1 is a cross-sectional view of a sample holder, according to Embodiment 1 of the present invention, as well as an experimental tool for performing experiments to know the pressure resistance of the holder.

FIG. 1 shows a sample holder 102 according to the present embodiment and an experimental tool for performing pressure resistance experiments on the sample holder. A sample-holding film 101 is formed on the sample holder 102. A sample (not shown) is placed on a first surface of the film 101. Fundamentally, the sample is placed under atmospheric pressure (atmospheric-pressure ambient).

On the other hand, a primary beam (electron beam or ion beam) is directed at the sample via the sample-holding film 101 and so the ambient in contact with a second surface of the sample-holding film 101 needs to be pumped down to a vacuum to permit passage of the primary beam while preventing scattering. Therefore, the sample-holding film 101 needs to withstand a differential pressure (i.e., the difference between the pressures of the ambients in contact with the surfaces) of at least 1 atm. In the present invention, it has been determined with some allowance that a resistance withstanding a pressure difference of 2 atm. is necessary. Conditions under which this resistance is obtained have been found.

The experiments were performed as shown in FIG. 1. The sample holder 102 having a frame-like member 102*a* forming the body of the holder 102 and the sample-holding film 101 providing a cover over an opening 102*b* formed in the frame-like member 102*a* was sandwiched between O-rings 103 and 104, which were held down by cases 105 and 106, respectively. Consequently, gas was prevented from flowing between spaces 107 and 108. The surface of the sample-holding film 101 in contact with the space 108 is herein referred to as the first surface. A sample was held or placed on this first surface. Accordingly, the pressure in the space 108 was increased while maintaining the atmospheric pressure in the space 107. The pressure at which the sample-holding film 101 was destroyed was measured. The experiment was repeated with various parameters which are various values of the thickness D (μm) and various values of the length L (μm) of the outer periphery of the film at the boundary with the sample-holding film or with a lattice.

Figure 2:
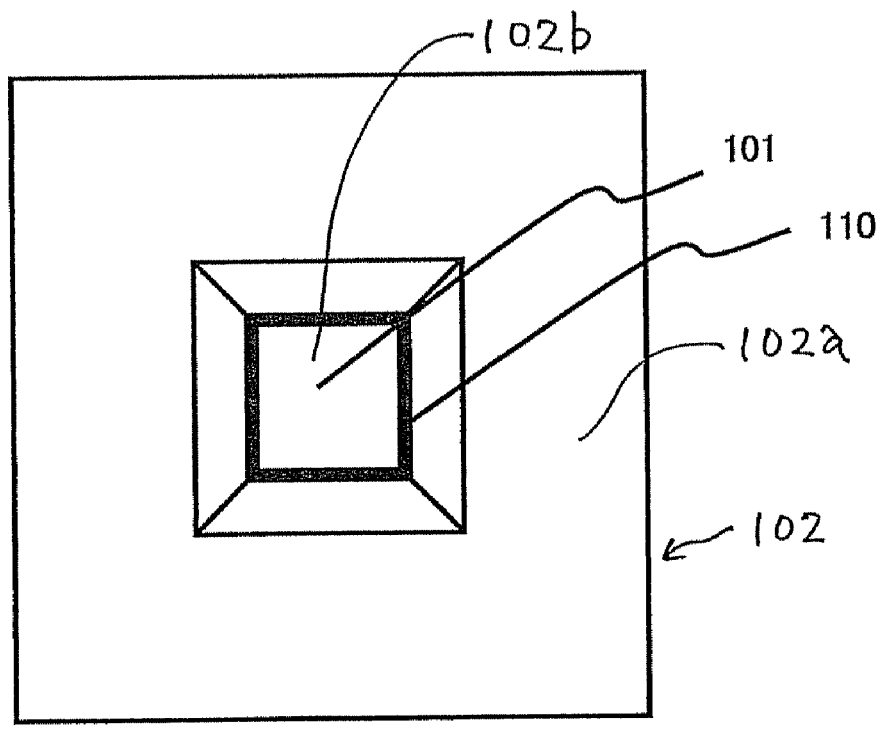
FIG. 2 is a plan view of the sample holder, according to Embodiment 1, showing the structure of the sample holder.

The length L is defined as follows. FIG. 2 is a view of the sample holder 102 as viewed from the direction of the space 107. In this figure, the length of the outer periphery 110 is L. That is, the length of the outer periphery 110 of the sample-holding film 101 that covers the opening 102*b* in the frame-like member 102*a* is L.

Referring to FIG. 3, where there is a lattice 111 for reinforcing the sample-holding film 101 in the opening 102*b* formed in the frame-like member 102*a*, L is the length of the outer periphery 112. That is, the length of the outer periphery of the portion of the sample-holding film 101 that covers opening portions 111*b* in the lattice 111 is L.

The results of the experiments are shown in FIG. 4. It has been found that there is a linear relationship between the destruction strength of the film and the ratio L/D and that 2 atm pressure resistance is achieved under the condition L/D <200,000 (L/D less than 200,000). Conversely, where the space 108 was kept at the atmospheric pressure and a pressure was applied to the space 107, the sample-holding film 101 was destroyed at a lower pressure than in the case of FIG. 4. Therefore, where the sample is placed on the surface of the sample-holding film 101 in contact with the space 108, danger of destruction of the film can be reduced.

The experimental results have shown that in the case of L/D <200,000, a pressure resistance withstanding 2 atm. or higher can be accomplished. It is considered that a realistic maximum value of the length L is about 20 mm where the production yield is taken into account. The corresponding minimum value of the thickness D is 100 nm. If the thickness D is greater than this value, scattering due to the sample-holding film 101 is increased conspicuously, deteriorating resolution in observation or inspection. Consequently, it is desired that the thickness D be set smaller than 100 nm.

It has also been found from the results of the experiments that where the thickness D is as small as 10 nm but the length L is less than 2,000 μm or where the thickness D is as small as 1 nm but the length L is 200 μm, if a sample is placed on the first surface of the sample-holding film 101 under atmospheric pressure and the second surface is exposed to a vacuum, the sample-holding film 101 is not destroyed. Under this condition, if an electron beam is directed at the sample through the second surface, secondary electrons emitted from the sample pass through the sample-holding film 101. The mean free path of secondary electrons is on the order of 10 nm. The secondary electrons can be detected by a secondary electron detector placed in an ambient (vacuum chamber) in contact with the second surface, and a secondary electron image can be obtained.

It is known that secondary electron images are sensitive to surfaces and produce high-resolution images. This can also be confirmed in the present invention. Therefore, it is more desired that the thickness D be set less than 10 nm. However, where D is reduced extremely, the production yield will be deteriorated. Accordingly, the thickness D is preferably set greater than 1 nm. In the past, only thick films could be formed, and secondary electron images could not be produced. Backscattered electron images have been used, and the resolution has been low. In the present invention, secondary electrons can be employed and, therefore, observation and inspection can be done at high resolution. In addition, sample holders can be mass produced because they are fabricated using MEMS processes.

Embodiment 2

Figure 5:
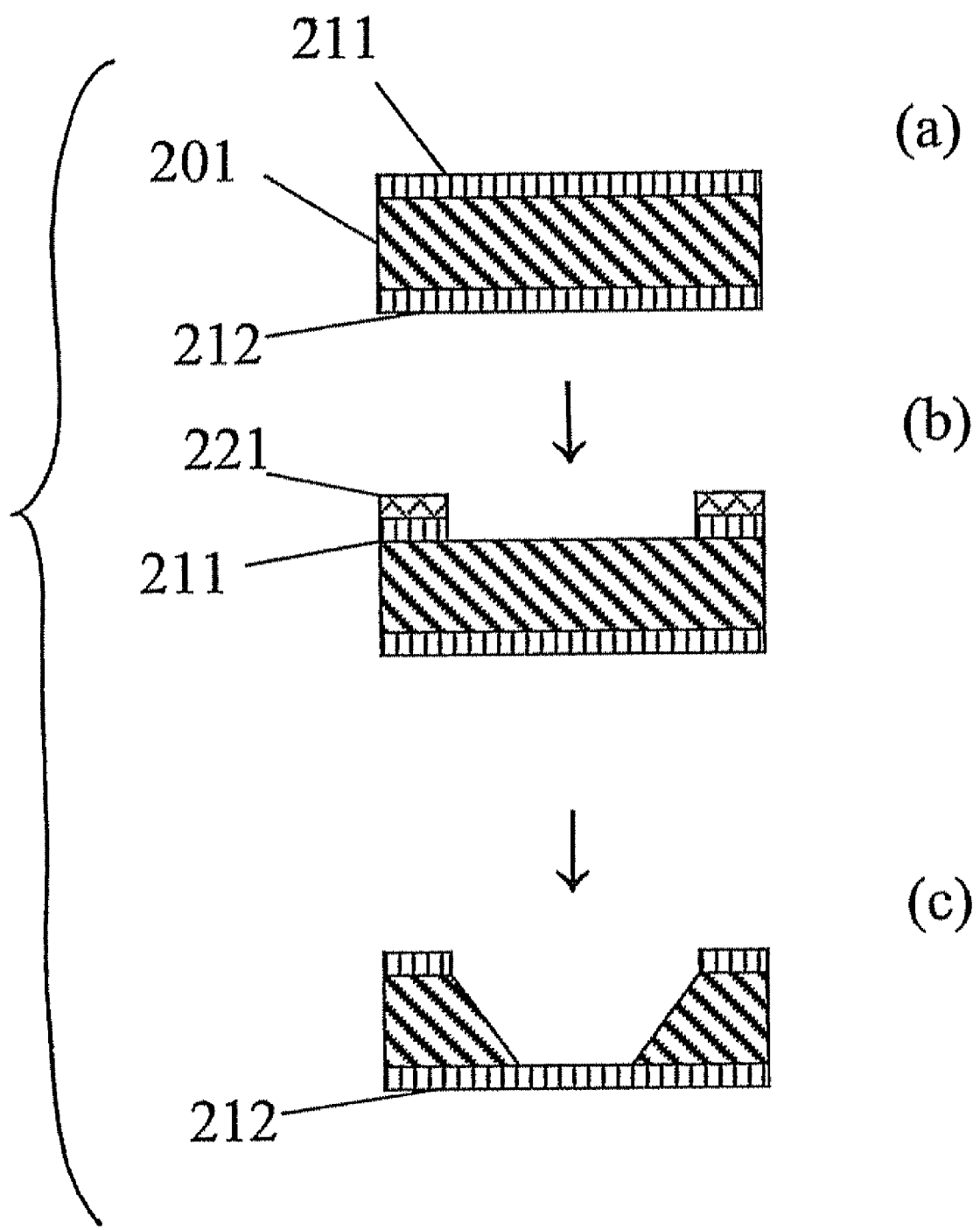
FIGS. 5 and 6 show vertical cross sections of a sample holder, according to Embodiment 2, illustrating a method of fabricating the holder.

A method of fabricating a sample holder is described by referring to FIG. 5. A silicon substrate 201 is mirror-polished on both its surfaces. Films of silicon nitride 211 and 212 are formed on both surfaces of the substrate using chemical vapor deposition (CVD) (FIG. 5(a)). After lithographically forming a resist pattern 221 using a photoresist, the silicon nitride film 211 is selectively etched using the resist pattern as a mask by RIE (reactive ion etching) (FIG. 5(b)). After removing the resist pattern 221 with sulfuric acid, the silicon substrate 201 is wet-etched using the silicon nitride film 211 as a mask and using KOH solution (FIG. 5(c)). A sample holder having the silicon nitride film 212 can be fabricated by the present sequence of processing steps.

A method of fabricating a sample holder including a thin film on which a lattice is formed is next described. Both surfaces of an SOI (silicon-on-insulator) wafer 202 (FIG. 6(a)) are mirror-polished. Silicon nitride films 211 and 212 are formed on both surfaces of the wafer 202 using chemical vapor deposition (CVD) (FIG. 6(a)).

Then, a resist pattern 221 is formed lithographically using a photoresist. Thereafter, the silicon nitride film 211 is selectively etched using the resist pattern as a mask by RIE (FIG. 6(b)). After removing the resist pattern 221 with sulfuric acid, a silicon substrate 203 is wet-etched using the silicon nitride film 211 as a mask and using KOH solution.

Figure 6:
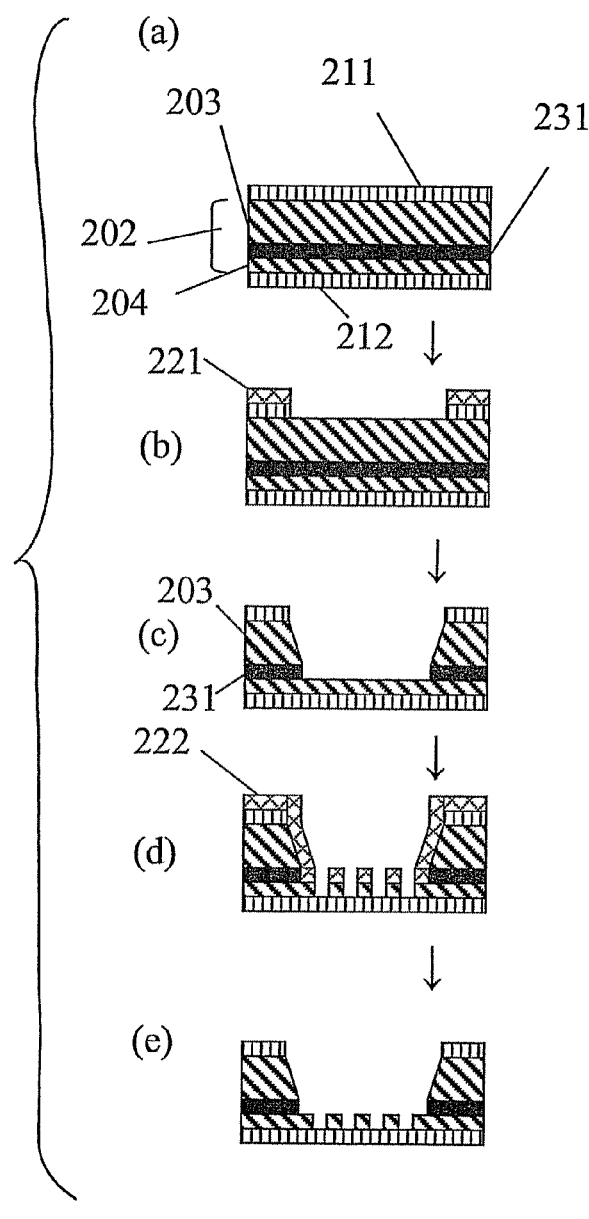

The silicon oxide film 231 is selectively removed using BHF (buffered hydrofluoric acid) (FIG. 6(c)). After a resist is sprayed on the surface, a pattern of a lattice is lithographically formed. Using the resist pattern 222 as a mask, silicon 204 is selectively etched using aqueous solution of TMAH (tetramethyl ammonium hydroxide) (FIG. 6(d)). Finally, the resist pattern 222 is removed with sulfuric acid. Consequently, the pattern of the lattice can be formed. This permits the length L of the outer periphery of the holding film to be reduced. Therefore, the holding film can be thinned.

Another method of forming the lattice is now described. A silicon substrate 201 whose both surfaces have been mirror-polished is prepared. Silicon nitride films 211 and 212 are formed on both surfaces of the silicon substrate 201 by chemical vapor deposition (CVD). Then, a silicon oxide film 232 is formed on one surface using CVD (FIG. 7(a)). A resist pattern 223 of a lattice is lithographically formed on the silicon oxide film 232 using a photoresist (FIG. 7(b)).

Using the resist pattern 223 as a mask, the silicon oxide film 232 is selectively removed by wet-etching using BHF to form a lattice pattern. The resist is removed using sulfuric acid (FIG. 7(c)). A photoresist is applied to the other side. A resist pattern 221 is formed lithographically using the photoresist.

Figure 7:
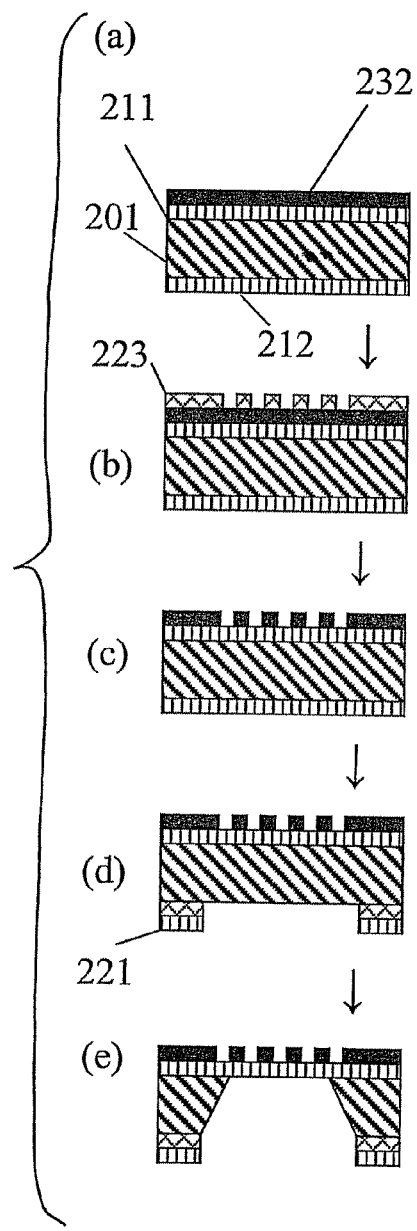
FIG. 7 shows vertical cross sections of the sample holder, according to Embodiment 2, illustrating another method of fabricating the holder.

Using the photoresist pattern, the silicon substrate 201 is etched by a method similar to the method of forming a sample holder having no lattice (FIG. 7(e)). In the present process, however, an aqueous solution of TMAH that does not etch silicon oxide was used instead of KOH. The present process permits the lattice to be formed without using an expensive SOI wafer.

Embodiment 3

Figure 8:
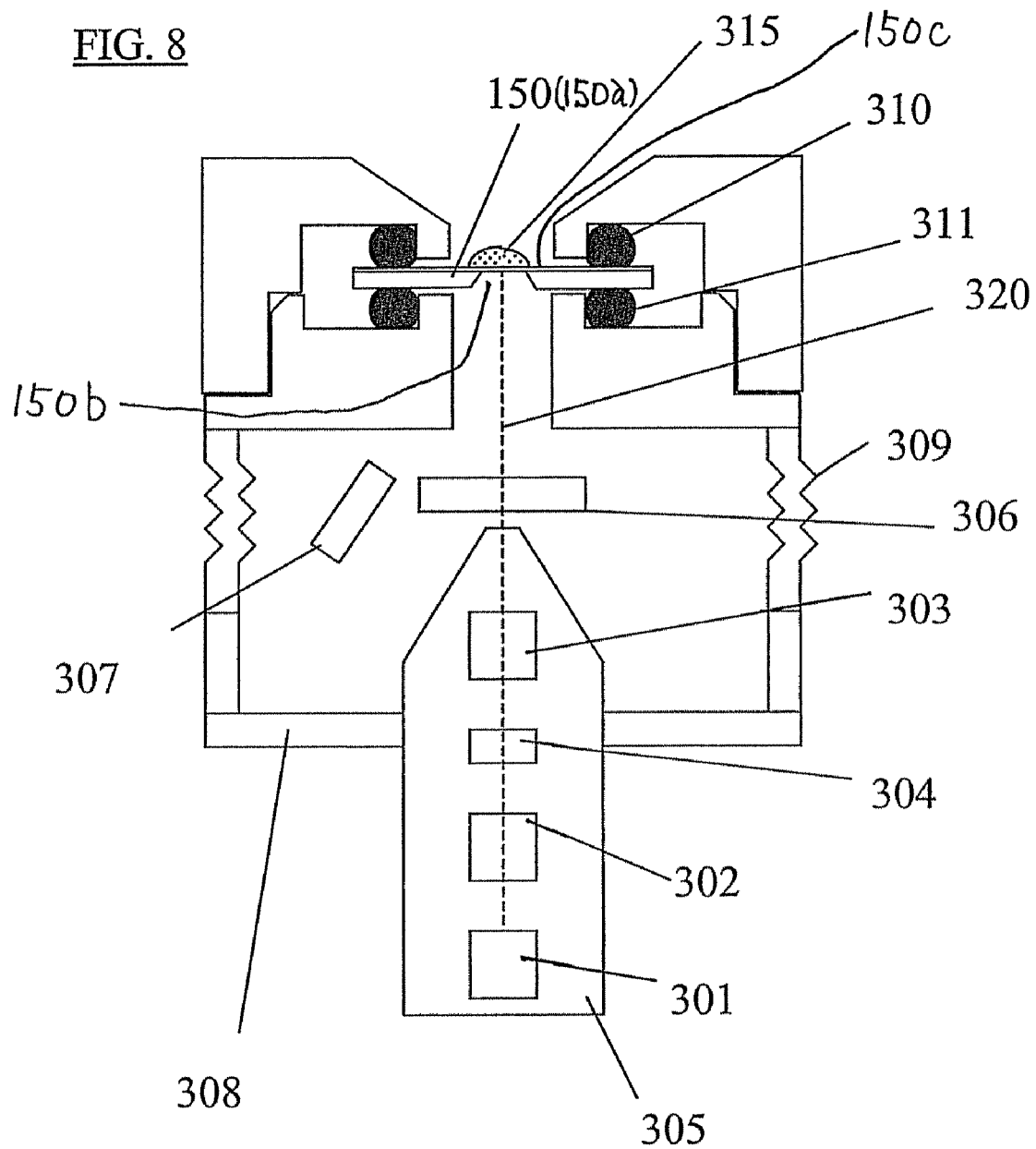
FIG. 8 is a schematic vertical cross section of a sample holder, according to Embodiment 3, showing the whole structure of the holder.

An observation-and-inspection apparatus, according to one embodiment of the present invention, is schematically shown in FIG. 8. The apparatus includes an electron optics column 305, a backscattered electron detector 306, a secondary electron detector 307, a vacuum chamber 308, a sample driving mechanism 309, and the sample holder 150 described in Embodiment 2. The electron optics column 305 includes an electron source 301, a condenser lens 302, an objective lens 303, and a scanning unit 304. The sample holder 150 is in contact with the vacuum chamber 308 via O-rings 310 and 311 that form support means for supporting the sample holder 150. Therefore, the inside of the chamber 308 can be pumped down to a vacuum or to a reduced-pressure level.

The sample holder 150 is composed of a frame-like member 150a forming the body of the holder and a sample-holding film 150c in the same way as the foregoing sample holder. The frame-like member 150a is provided with an opening 150b covered with the sample-holding film 150c. A sample 315 containing liquid, for example, is held on the sample-holding film 150c. Because of this structure, when an electron beam 320 is directed at the sample 315 in an atmospheric-pressure ambient via the sample-holding film 150c of the sample holder 150, backscattered electrons and secondary electrons produced from the sample 315 can be detected. Consequently, a high-resolution SEM image of the sample 315 in the atmospheric-pressure ambient can be obtained.

In the configuration of the present embodiment, an electron beam is used. Imaging can also be done using an ion beam.

Especially, using a focused helium ion beam, observation can be made with less damage to the sample-holding film 150c.

Embodiment 4

Figure 9:
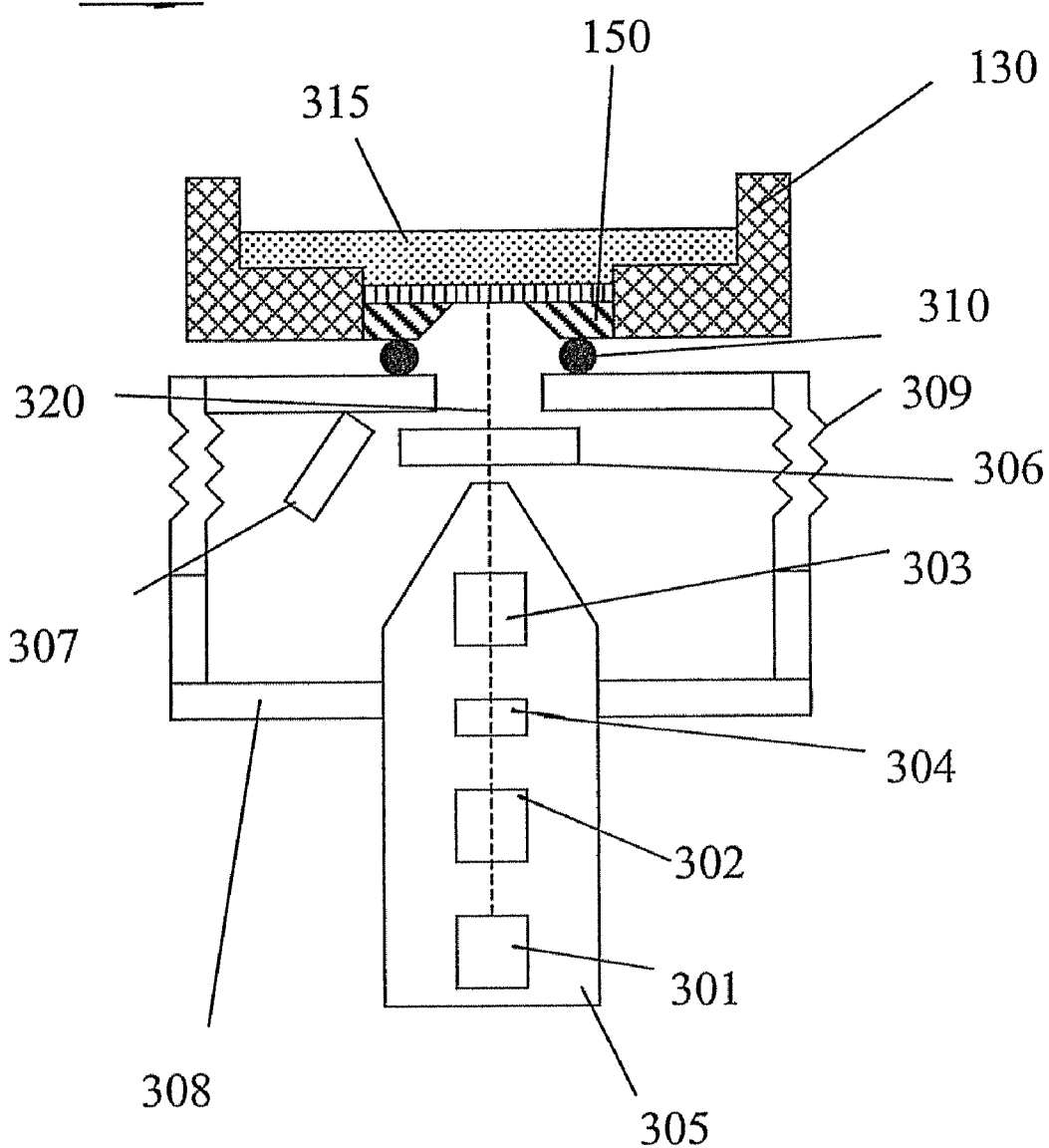
FIG. 9 is a schematic vertical cross section of a sample holder, according to Embodiment 4, showing the whole structure of the holder.
Figure 10A:
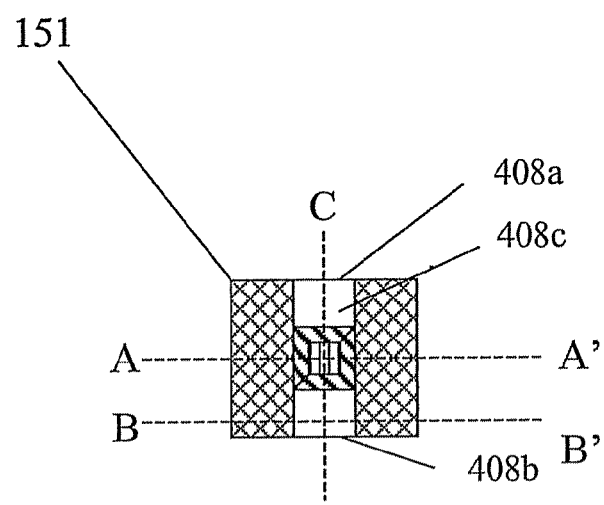
FIG. 10(a) shows vertical cross sections of a sample holder, according to Embodiment 5, showing the structure of the holder
Figure 10D:
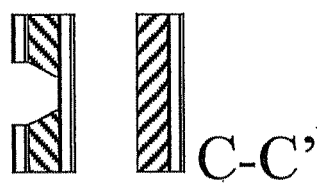
FIGS. 10(b), 10(c), and 10(d) show sections taken along lines A-A', B-B', and C-C', respectively.
Figure 10B:
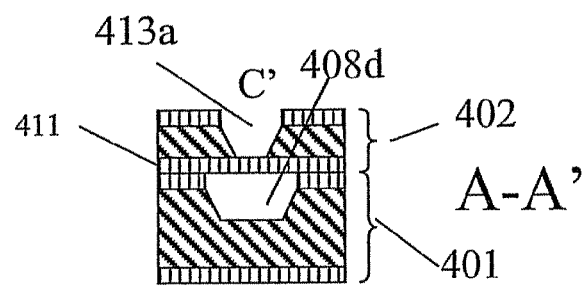
Figure 10C:

The configuration of the present embodiment is schematically shown in FIG. 9. The present embodiment is similar to Embodiment 3 except for the following point. In Embodiment 3, the sample holder is held from above and below it using the O-rings 310 and 311. In Embodiment 4, only the O-ring 310 forming support means is disposed between the sample holder 150 and the vacuum chamber 308. Furthermore, in Embodiment 4, a laboratory dish 130 is disposed around the sample 315 containing liquid to prevent the sample 315 from spilling out. Because of these features, when the inside of the chamber 308 is pumped down, the reduced-pressure state can be maintained only with the O-ring 310. In consequence, the sample holder can be held easily. Instead of the O-ring 310, grease can be used. In the following embodiments, grease can be similarly used.

Embodiment 5

The structure of a sample holder 151, according to the present embodiment, is shown in FIG. 10. FIG. 10(a) is a top plan view of the holder. FIG. 10(b) is a cross-sectional view taken on line A-A' of FIG. 10(a). FIG. 10(c) is a cross-sectional view taken on line B-B' of FIG. 10(a). FIG. 10(d) is a cross-sectional view taken on line C-C' of FIG. 10(a). The sample holder 151 is composed of a holder base 401 and a holder cap 402. The base 401 has an entrance 408a, an exit 408b, and a channel 408c. The cap 402 is provided with an opening 413a. Consequently, a part of the film 411 is exposed. A sample-holding space 408d is located under the opening 413a in the film 411.

The sample holder 151 is fabricated by a method similar to the method of Embodiment 2. The holder base 401 and the holder cap 402 are formed independently by a method similar to the method of Embodiment 2. However, when the holder base 401 is formed, etching of silicon is stopped during the process. The depth of the channel 408c is controlled. The holder base 401 and holder cap 402 fabricated in this way are adhesively bonded as shown in FIG. 10.

Figure 11:
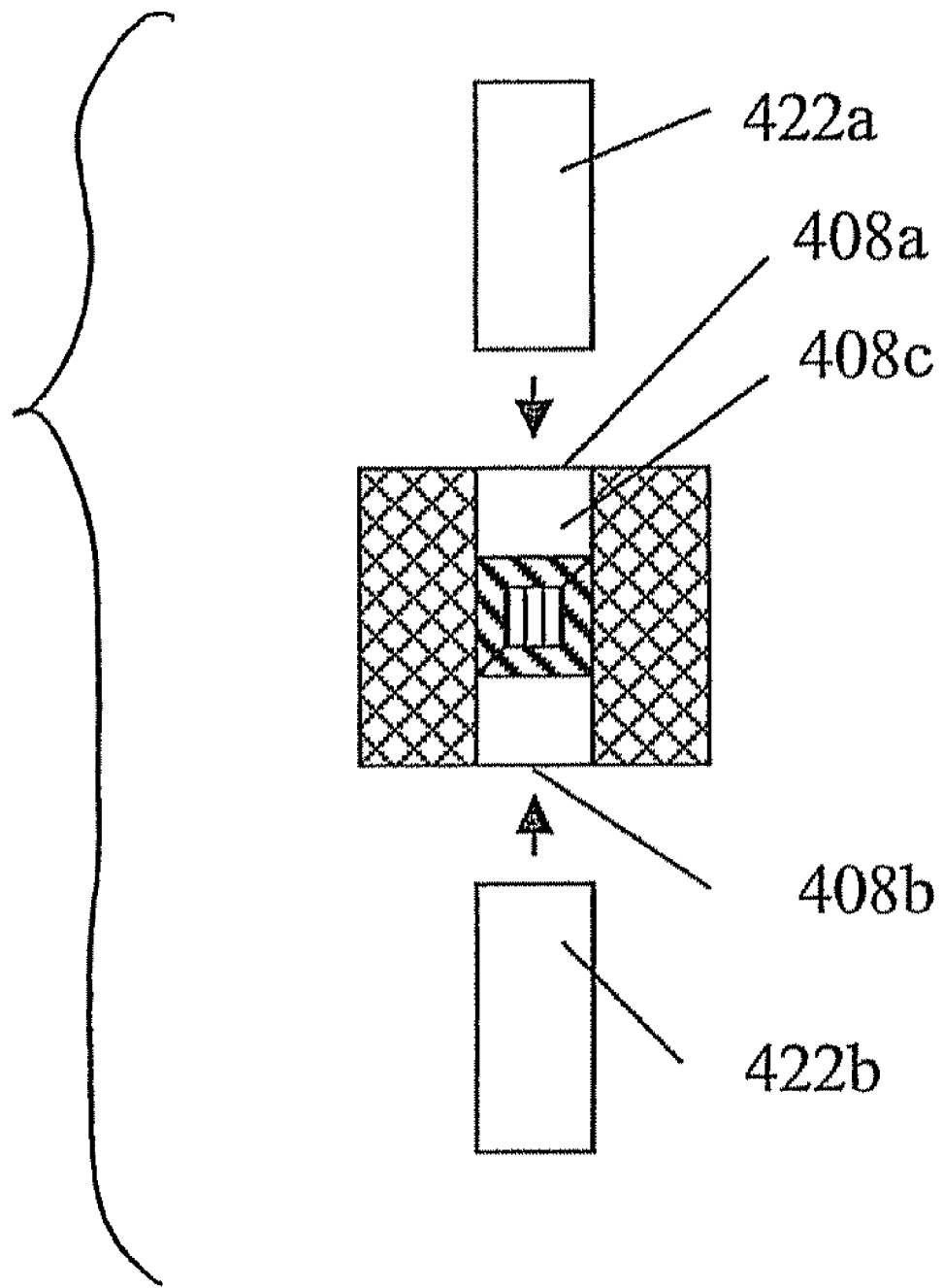
FIG. 11 shows a method of connecting pipes to the sample holder, according to Embodiment 5.

As shown in FIG. 11, pipes 422a and 422b are connected with the entrance 408a and exit 408b, respectively, of the sample holder 151. A sample is supplied into the channel 408c in the sample holder 151 via the pipe 422a connected with the entrance 408a. The sample is appropriately expelled from the pipe 422b connected with the exit 408b of the channel 408c.

Figure 12:
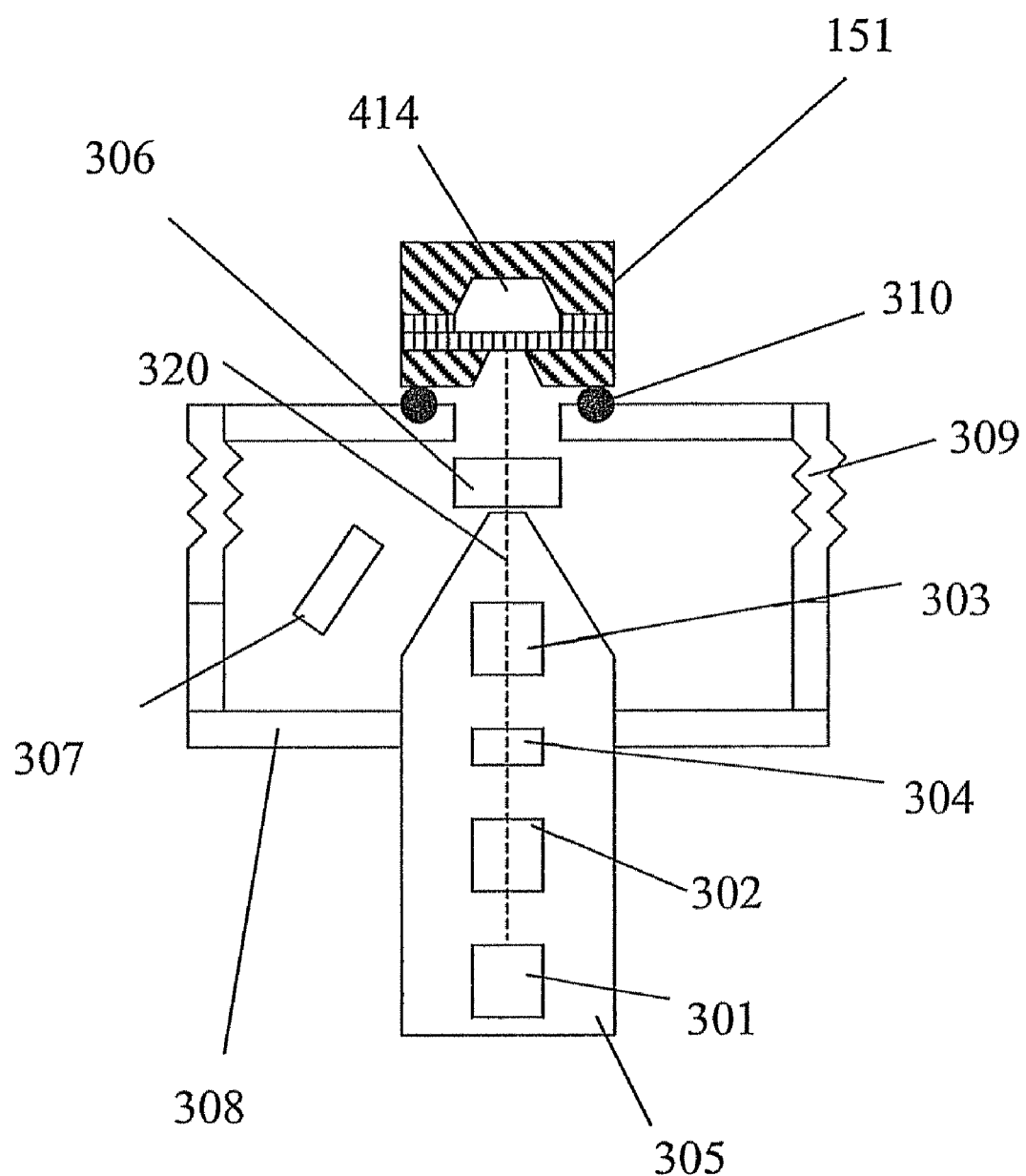
FIG. 12 is a schematic vertical cross section of the sample holder, according to Embodiment 5, showing the whole structure of the holder.

The whole structure of the observation-and-inspection apparatus using this sample holder is shown in FIG. 12. This structure is fundamentally similar to the structure of Embodiment 4 except that no laboratory dish is used and that a channel is used to prevent the sample containing liquid from spilling out.

By using this structure, a sample can be easily inserted into the sample holder 151. The sample 414 disposed in the channel 408c within the sample holder 151 can be irradiated and scanned with a focused electron beam 320 via the opening 413a. Backscattered electrons or secondary electrons induced by the electron beam 320 can be detected by a backscattered electron detector 306 or a secondary electron detector 307. Consequently, an SEM image of the sample 414 can be obtained. This structure permits the sample containing liquid to be observed or inspected.

Embodiment 6

The configuration of the present embodiment is similar to Embodiment 5 except that a lattice structure is disposed on the thin film portion of the sample holder 151. Because of this structure, a thin film of reduced thickness can be used.

Figure 13:
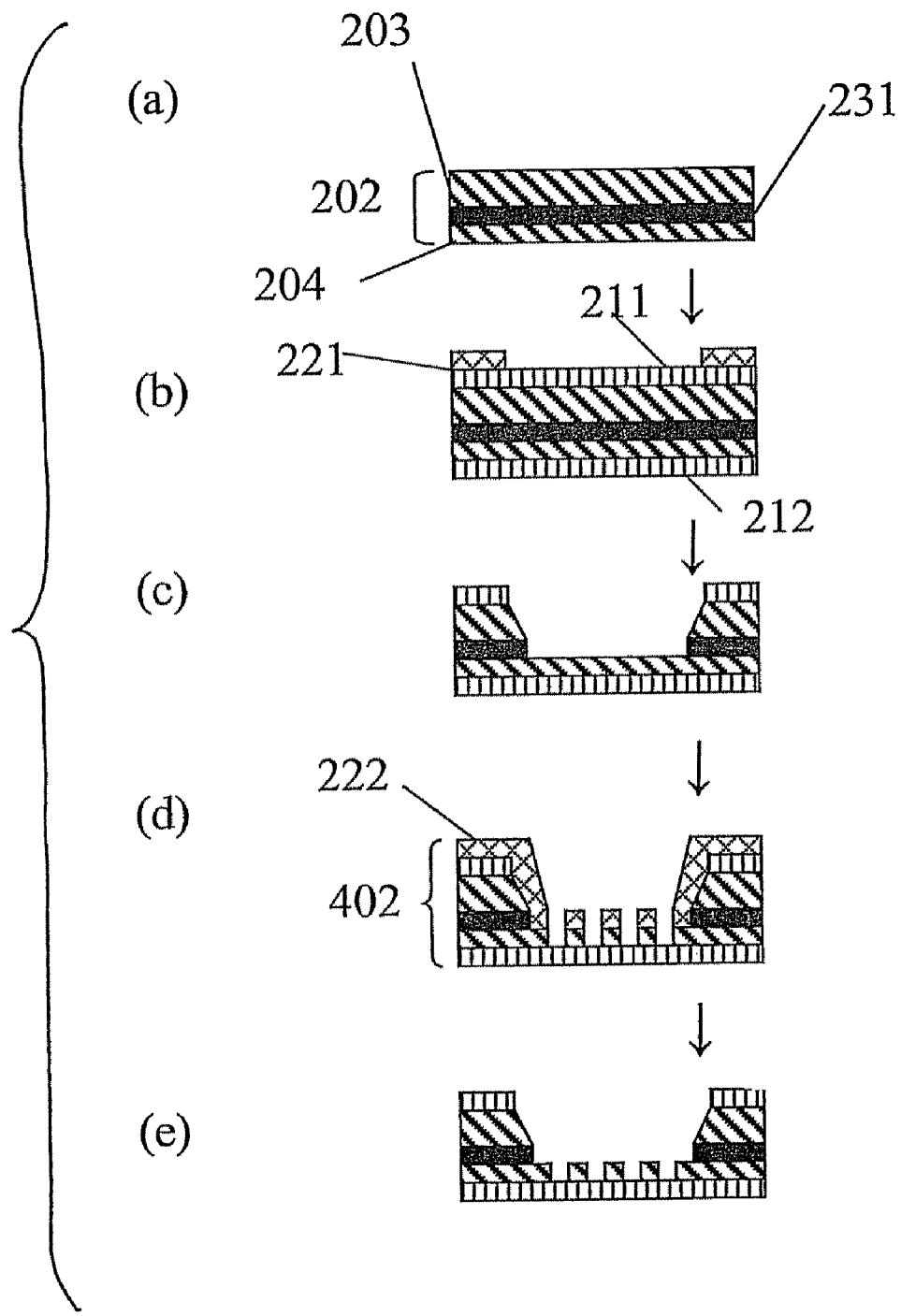
FIG. 13 shows vertical cross sections of a sample holder, according to Embodiment 6, illustrating a method of fabricating the holder.
Figure 14:
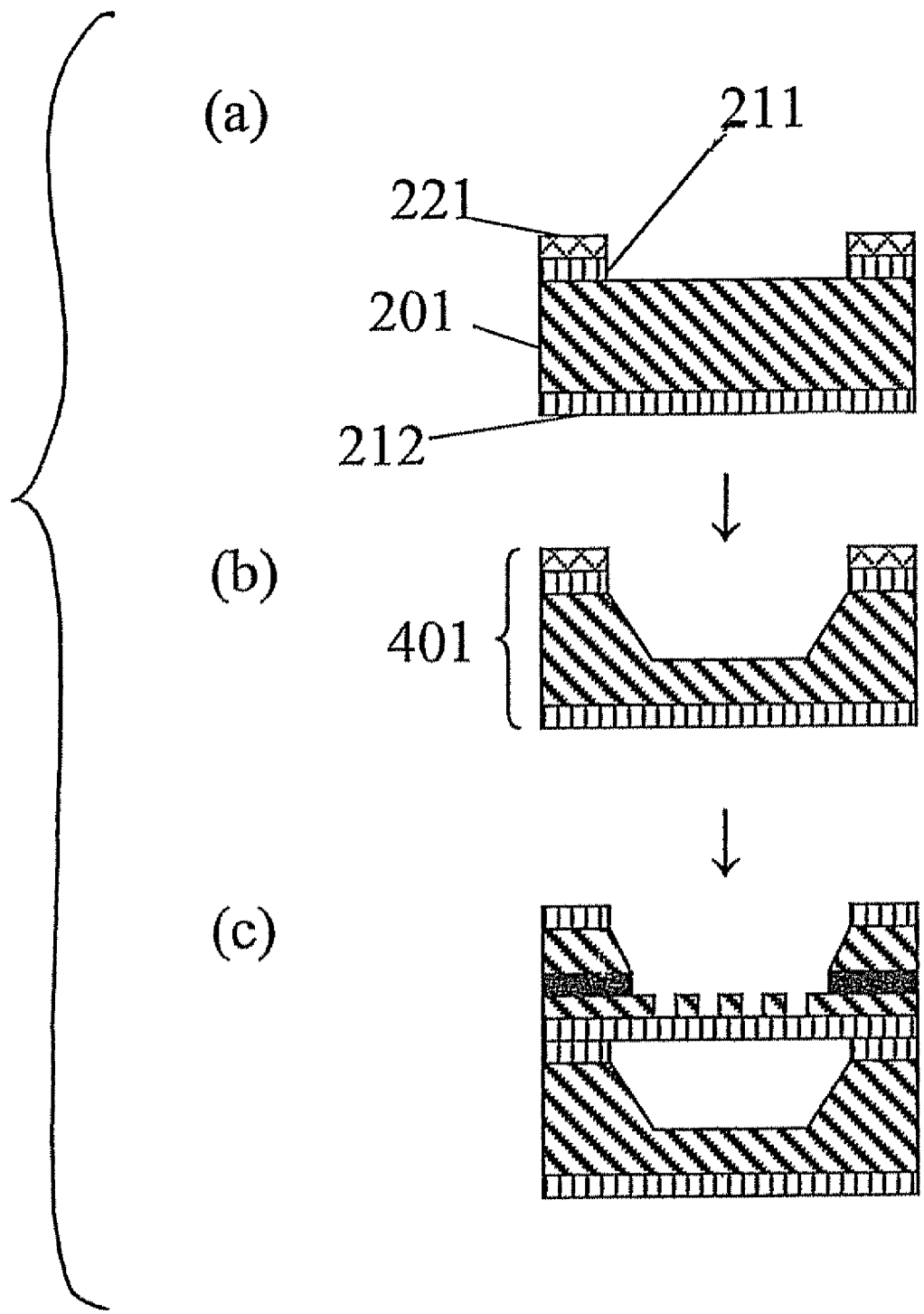
FIG. 14 shows vertical cross sections of a sample holder, according to Embodiment 6, illustrating another method of fabricating the holder.
Figure 15A:
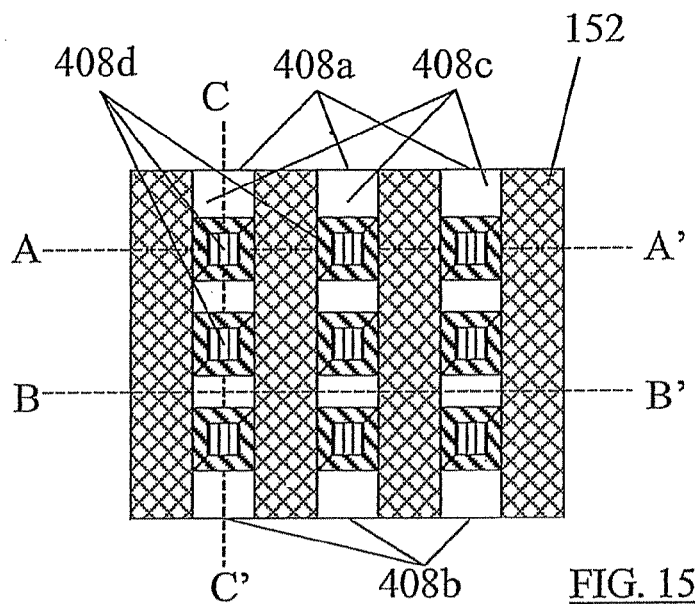
FIG. 15(a) shows a vertical cross sections of a sample holder, according to Embodiment 7, showing the structure of the holder and FIGS. 15(*b*), 15(*c*), and 15(*d*) show sections taken along lines A-A', B-B', and C-C', respectively.
Figure 15D:
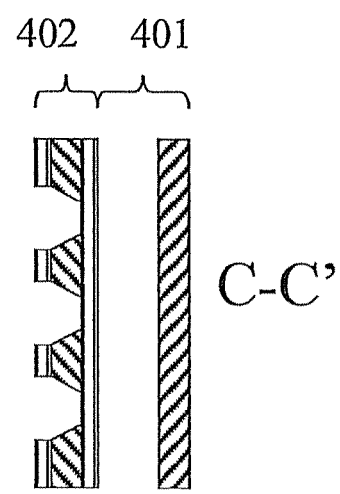
Figure 15B:
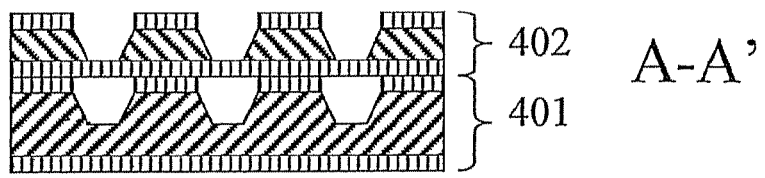
Figure 15C:
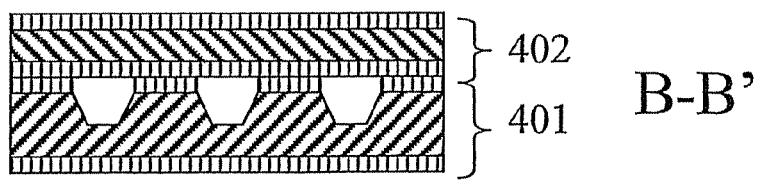

A method of fabricating the present sample holder is as follows. The holder cap 402 is formed by steps similar to the steps of Embodiment 2 (see FIG. 13). Also, the holder base 401 is formed (see FIG. 14). Finally, the holder base 401 and holder cap 402 are bonded together adhesively (see FIG. 14).

Because of the configuration described so far, a holder having a thinner thin film can be fabricated. Consequently, a sample containing liquid can be observed or inspected at high resolution.

Embodiment 7

Figure 16:
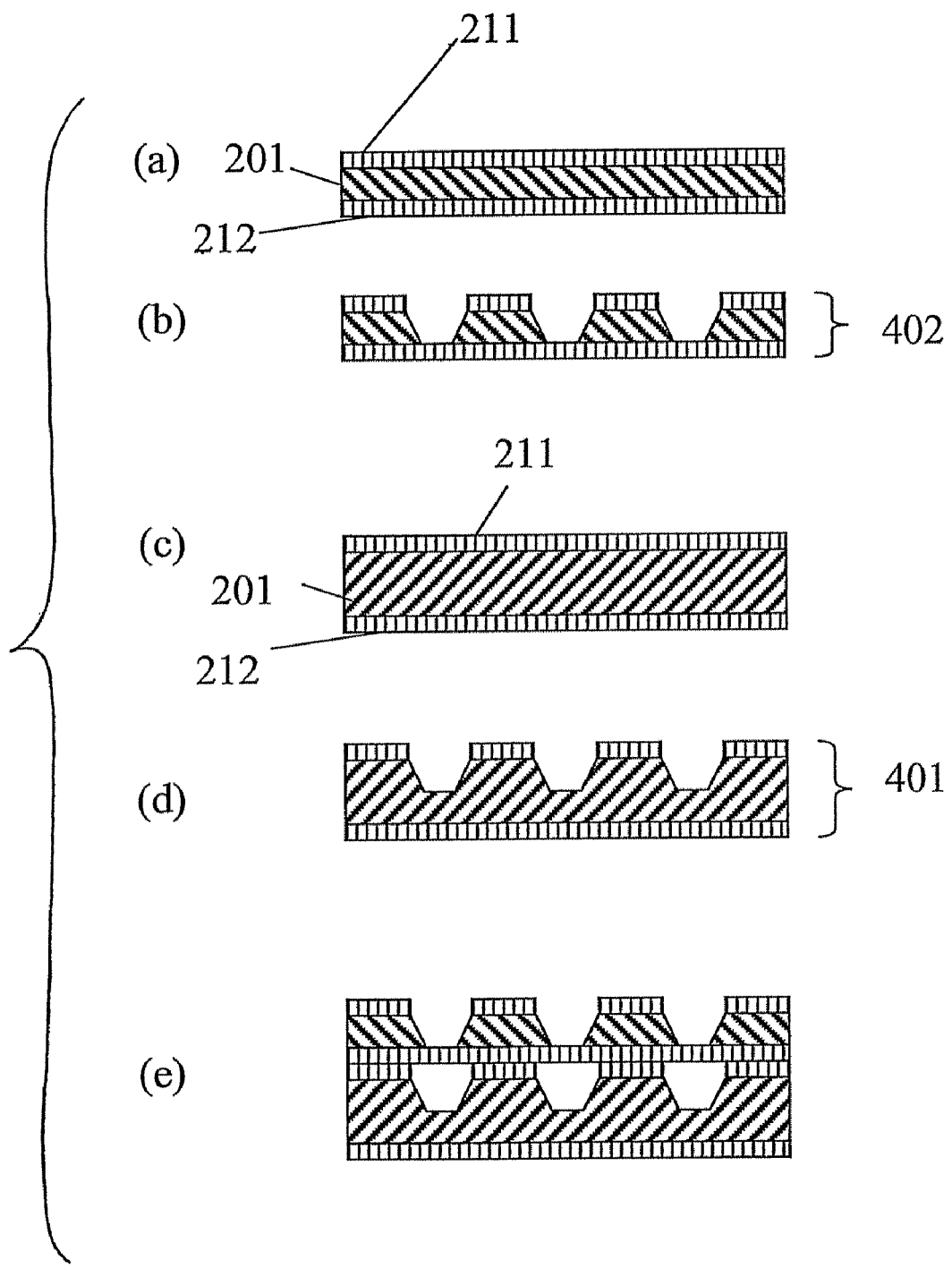
FIG. 16 shows vertical cross sections of a sample holder, according to Embodiment 7, illustrating a method of fabricating the holder.
Figure 17A:
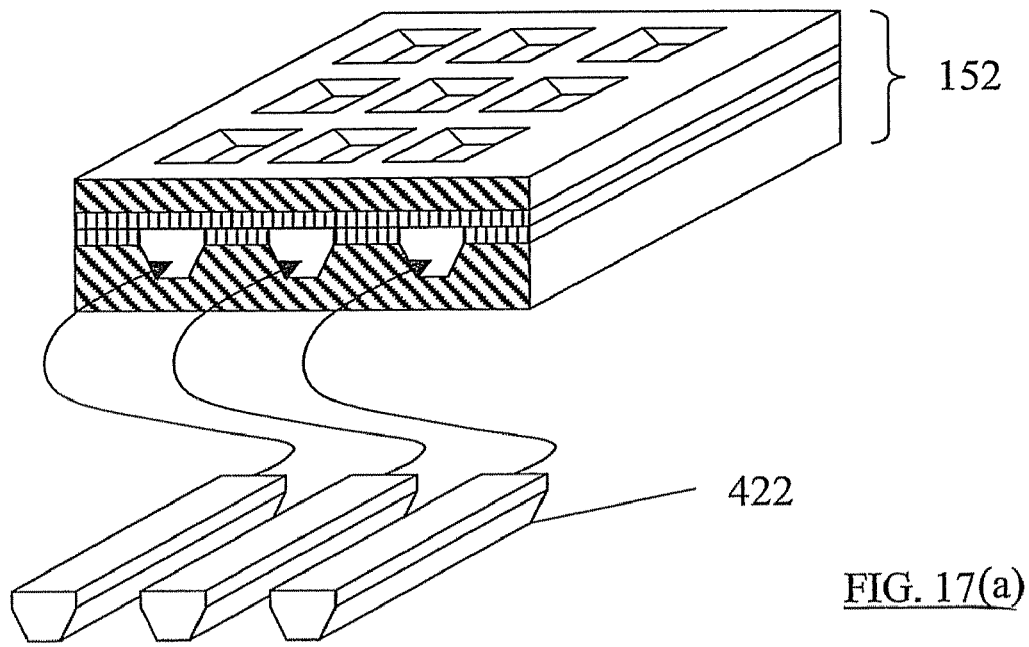
FIGS. 17(*a*) and 17(*b*) show a method of connecting pipes to the sample holder, according to Embodiment 7.
Figure 17B:
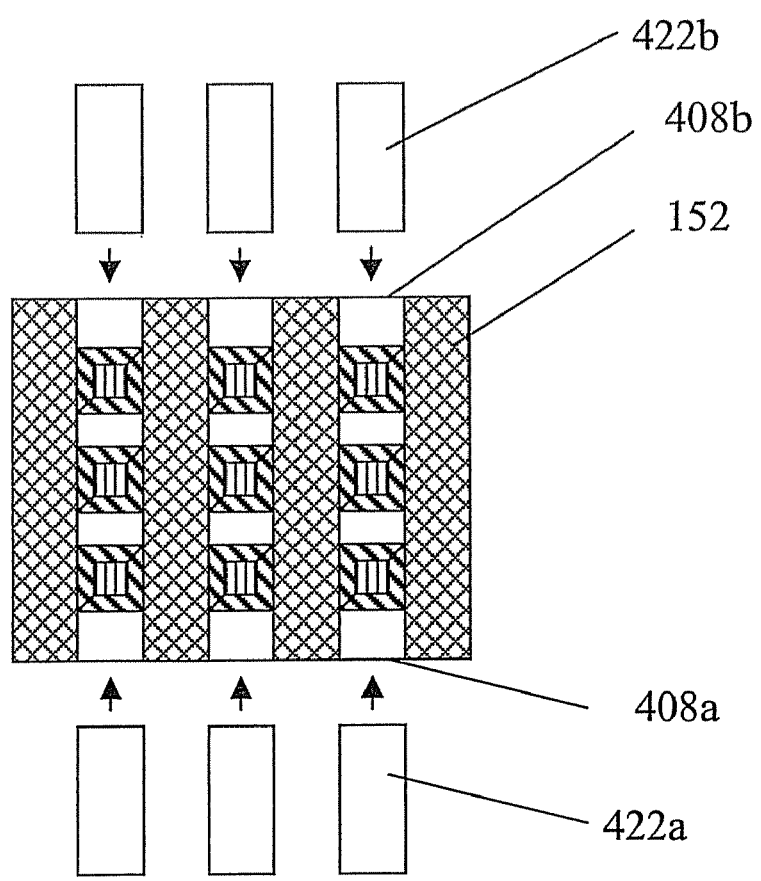

The present embodiment is similar to Embodiment 5 except that plural entrances 408a, plural exits 408b, plural channels 408c, and plural sample-holding spaces 408d are all formed in the same sample holder 152 (see FIG. 15). FIG. 15(b) is a cross-sectional view taken on line A-A' of FIG. 15(a). FIG. 15(c) is a cross-sectional view taken on line B-B' of FIG. 15(a). FIG. 15(d) is a cross-sectional view taken on line C-C' of FIG. 15(a). The sample holder is fabricated in the same way as in Embodiment 6. The method is schematically illustrated in FIG. 16. FIG. 17(a) and FIG. 17(b) schematically shows the manner in which pipes 422a and 422b for introducing samples into the cell are connected. Because of this structure, plural samples can be efficiently observed or inspected.

Embodiment 8

Figure 18:
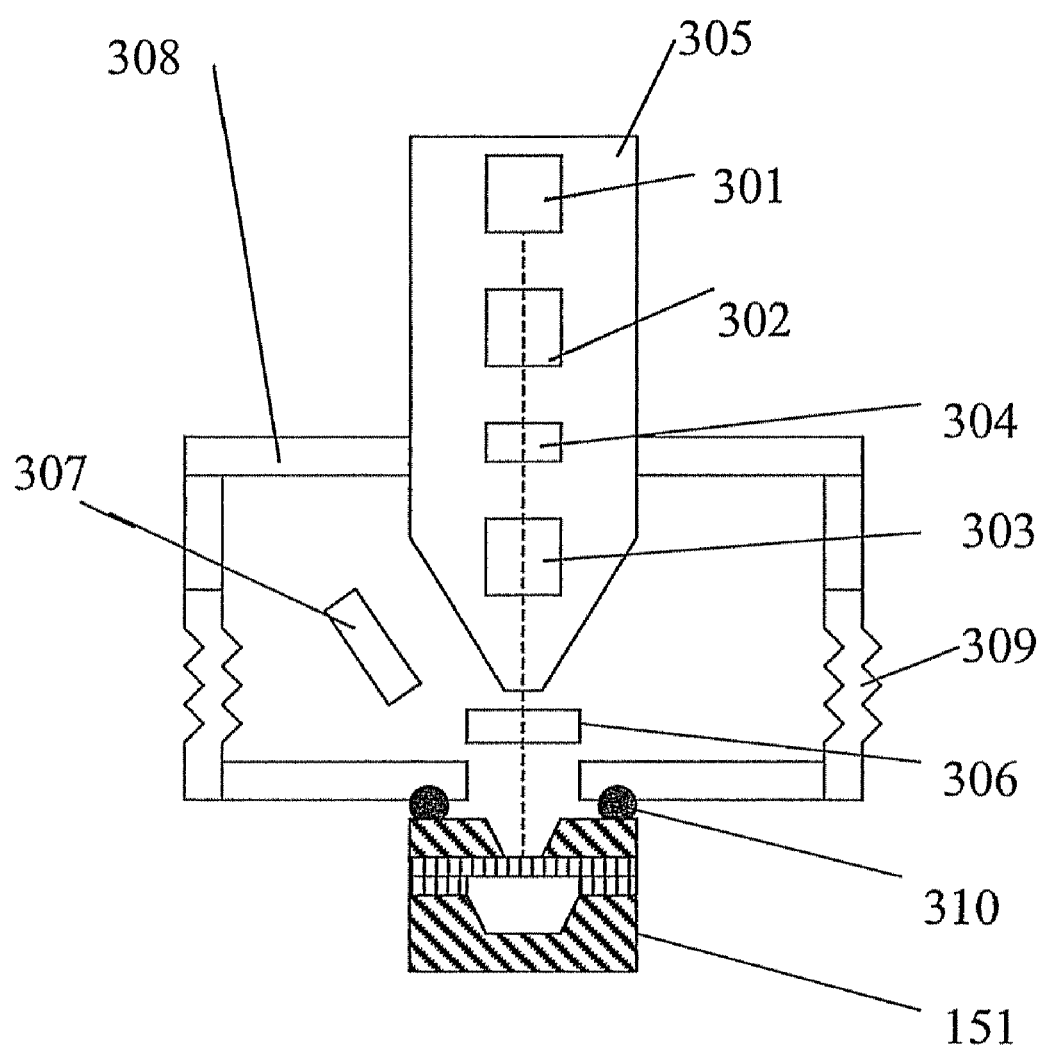
FIG. 18 is a vertical cross section of a sample holder, according to Embodiment 8, showing the whole structure of the holder.

The present embodiment is similar to Embodiment 5 except that an electron beam can be emitted downward from above (see FIG. 18). Because of this structure, intrusion of dust into the electron optics column can be suppressed.

Embodiment 9

Figure 19A:
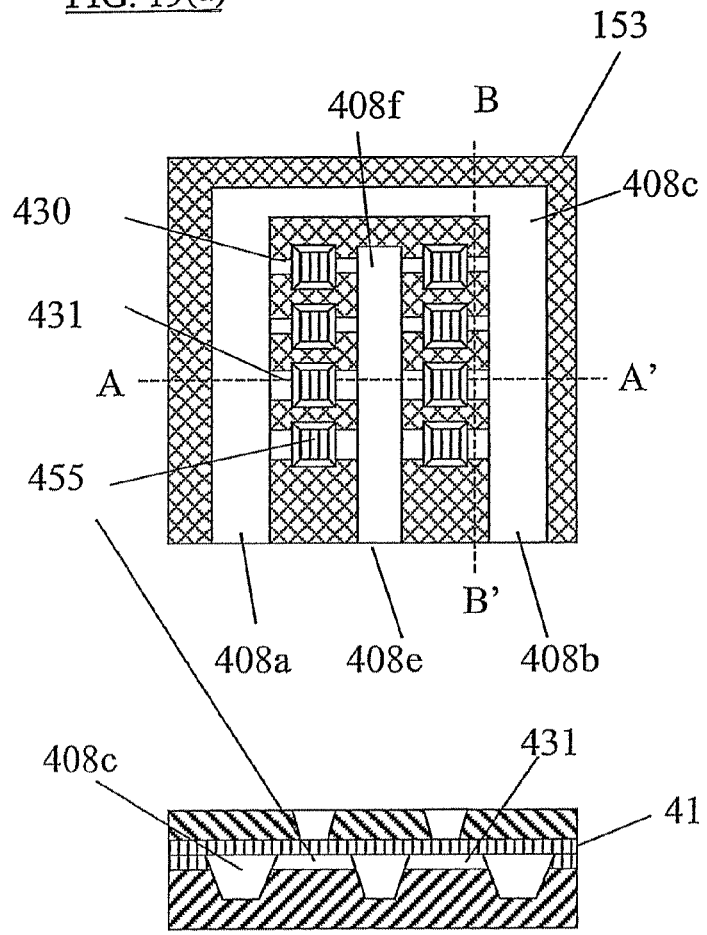
FIG. 19(*a*) shows a sample holder, according to Embodiment 9, showing the whole structure of the holder and FIGS. 19(*b*), and 19(*c*) show sections taken along lines A-A' and B-B', respectively.
Figure 19C:
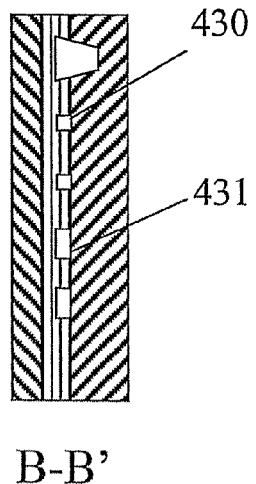

A sample holder 153 according to the present embodiment is schematically shown in FIG. 19. FIG. 19(a) is a top plan view of the holder 153. FIG. 19(b) is a cross-sectional view taken on line A-A' of FIG. 19(a). FIG. 19(c) is a cross-sectional view taken on line B-B' of FIG. 19(a). The present sample holder 153 is fabricated by a method similar to the method of Embodiment 5. However, a delivery port 408e is formed in addition to the entrance 408a and exit 408b. Furthermore, branching channels 430, 431 and a delivery channel 408f are formed in addition to the channel 408c. In one feature of this embodiment, the depth of the branching channels (i.e., the width extending perpendicularly to the film 411) is set smaller than the depth of the channel 408c.

The thickness of observation portions 455 located immediately under the film 411, i.e., the width extending perpendicularly to the film 411, is set to 10 nm to 20 μm. More preferably, the thickness of the observation portions is set larger than the size of the ingredients included in the sample by a factor of 1.1 to 1.2. Consequently, when a sample containing a liquid component is introduced into the sample holder 153, the ingredients to be observed or inspected are brought close to the film 411. This can reduce the degree to which the electron beam is scattered by the liquid component interposed between the film 411 and the ingredients. As a result, a good SEM image can be obtained from over the whole inside of each observation portion. Where the sample contains atmosphere, the principle of the present embodiment can be similarly applied.

The depth of the observation portions 455 located immediately under the film 411, i.e., the width of the branching channels 430 and 431 extending perpendicularly to the film 411, is set to 10 nm to 5 μm. This reduces the path of the electron beam within the sample holder 153 when a sample containing a liquid component is introduced into the sample holder 153. Consequently, the degree to which the electron beam is scattered by liquid and gas can be reduced. Hence, a good SEM image can be obtained from over the whole inside of each observation region.

Embodiment 10

Figure 20:
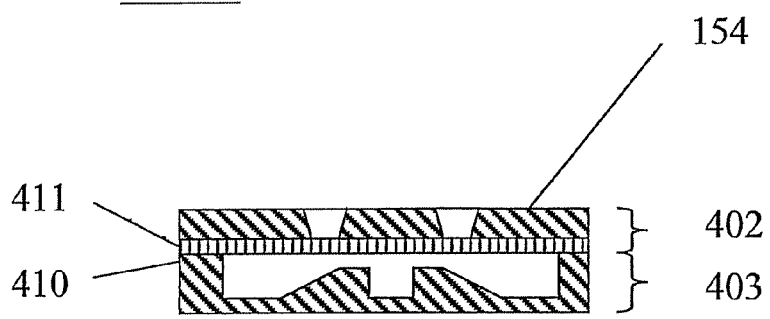
FIG. 20 is a vertical cross section of a sample holder, according to Embodiment 10, showing the structure of the holder.

FIG. 20 is a cross-sectional view of the sample holder 154 of the present embodiment. The structure of the present sample holder is similar to the structure of Embodiment 9 except that the depth (width extending perpendicularly to the film 411) of some parts of the branching channels 430 and 431 varies continuously and that the holder base 403 is made of PDMS (polydimethyl siloxane) to provide such continuous control of the depth.

Because of this structure, the ingredients within the sample containing liquid can be smoothly guided to the observation portions. Ingredients having different sizes can be placed at different positions by continuously varying the depth, especially immediately under the observation portions. Consequently, observation and inspection can be facilitated.

Embodiment 11

Figure 21:
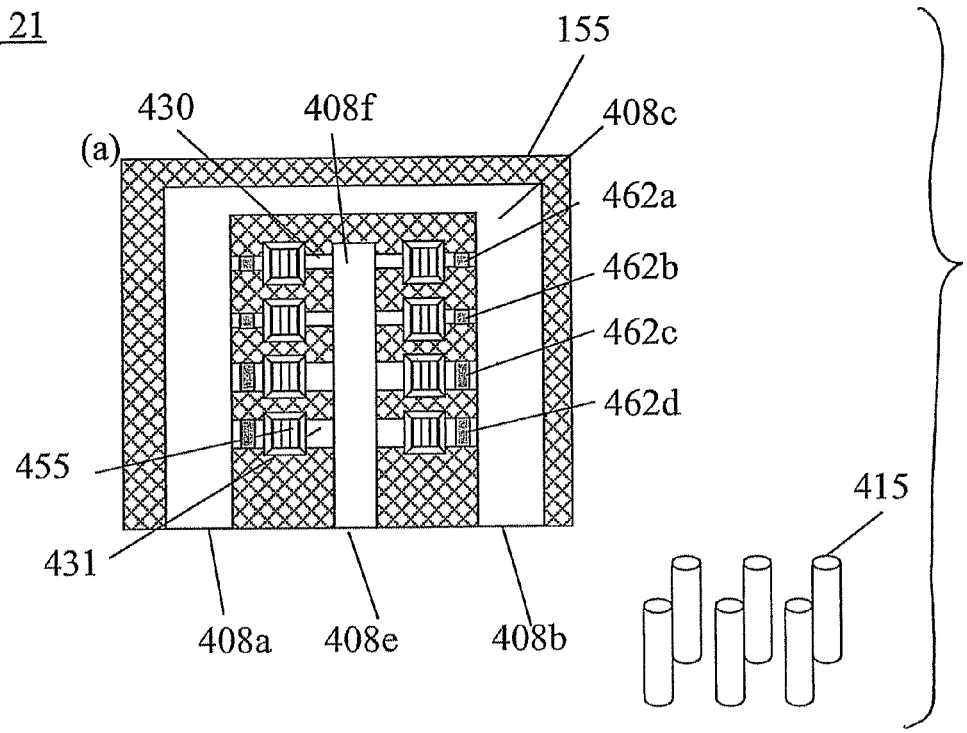
FIG. 21 shows the configuration of a sample holder, according to Embodiment 11.

A sample holder 155 according to the present embodiment is similar to the sample holder of Embodiment 9 except that filters 462a, 462b, 462c, and 462d are mounted, respectively, in the branching channels 430 of small cross section connected with the channel 408c as shown in FIG. 21. Protrusive pillars 415 shown in FIG. 21 are mounted as these filters. The spacing between the protrusive pillars is different among the filters 462a, 462b, 462c, and 462d.

Because of this configuration, sample ingredients having different sizes can be introduced to the observation portions 455. As a result, ingredients different in size can be selectively observed or inspected. The protrusive members are not limited to pillars. Convex members can also be mounted. Furthermore, balls may be mounted.

Embodiment 12

Figure 22:
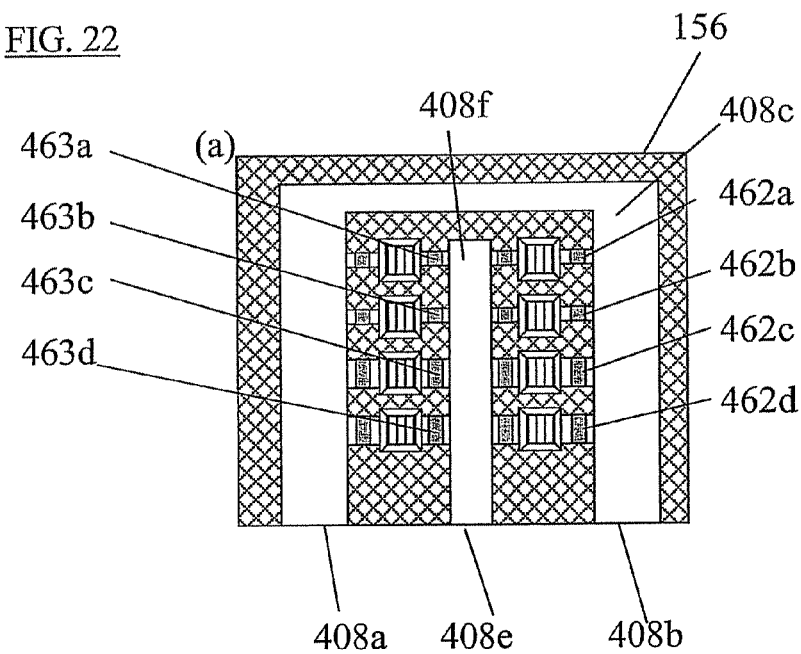
FIG. 22 shows the configuration of a sample holder, according to Embodiment 12.

A sample holder 156 of the present embodiment is similar to the sample holder of Embodiment 11 except that filters 463a, 463b, 463c, and 463d different from the filters 462a-462d are disposed in the portions located between the observation portions 455 of the branching channels 430 and the delivery channel 408f (see FIG. 22). These filters are made of protrusive members in the same way as in Embodiment 11. In one feature of Embodiment 12, however, the spacing between the protrusive members of the filters 463a-463d is smaller than the spacing between the protrusive members of the aforementioned filters 462a-462d.

The sample holder of the present embodiment operates as follows. First, a sample is introduced from the entrance 408a toward the exit 408b to fill the channel 408c with the sample, in the same way as in Embodiment 11. Then, the delivery port 408e is pumped down. The branching channels 430 in communication with the observation portions 455 are filled with the sample. At this time, the filters 462a-462d permit ingredients having different sizes to pass into the locations under the observation portions 455.

The pressures at the entrance 408a, exit 408b, and delivery port 408e are made substantially equal. Under this condition, the sample is discharged from the exit 408b. At this time, the sample is left at the observation portions 455 but the sample is eliminated from the channel 408c. In this state, the delivery port 408e is pumped down. Consequently, only the liquid component can be discharged from the delivery port 408e through the branching channels 430 and through the delivery channel 408f via the filters 463a-463d. As a result, only ingredients having no liquid component can be left at the observation portions 455.

Where there is liquid inside the sample holder 152, the electron beam 320 incident on the film 411 is scattered by the liquid. In contrast, in the present embodiment, liquid is selectively discharged and only ingredients can be brought to the observation portions 455. Therefore, scattering due to liquid can be prevented. Consequently, the electron beam 320 is less scattered. In consequence, observation and inspection can be performed at improved resolution.

Embodiment 13

Figure 23:
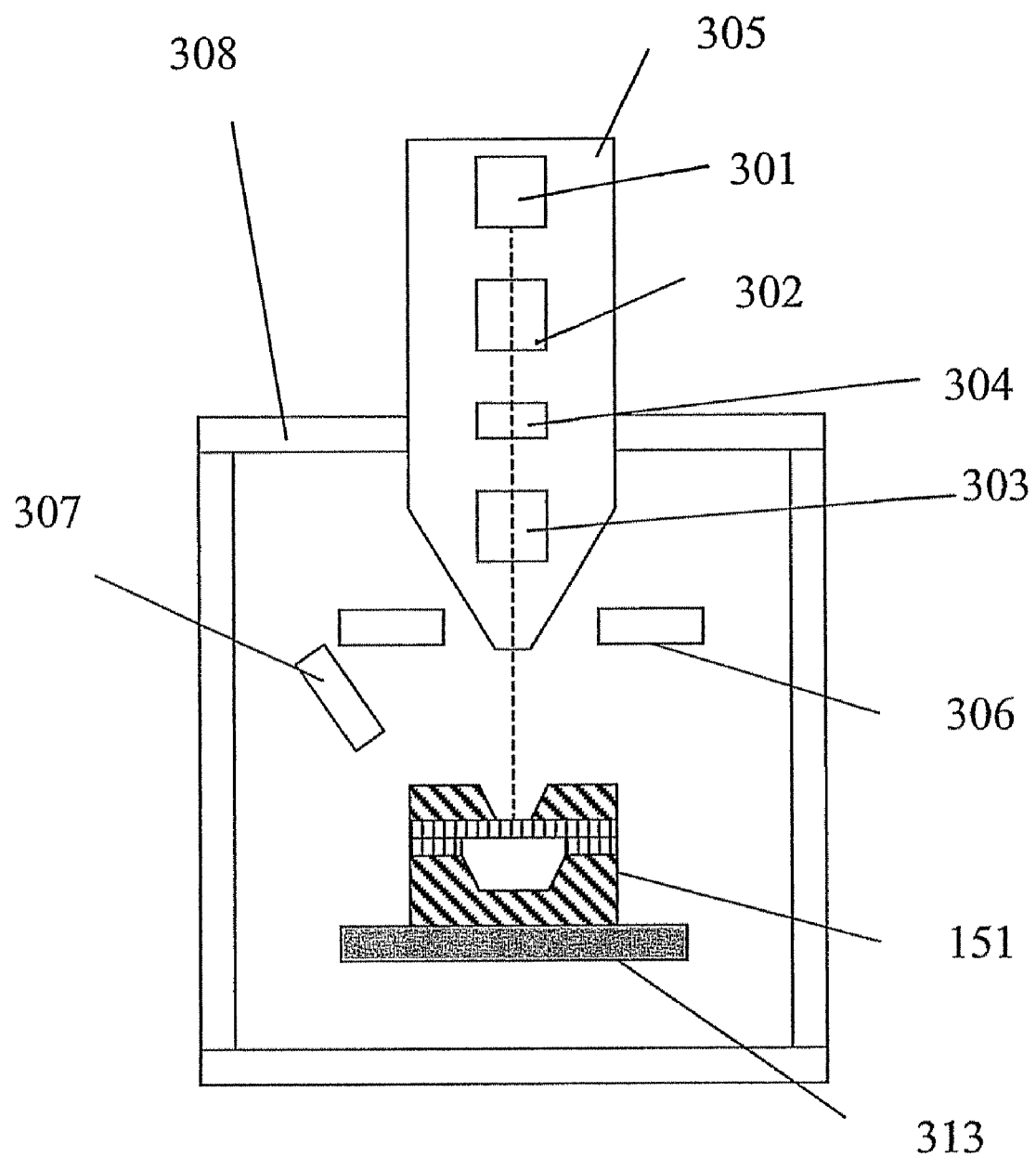
FIG. 23 is a vertical cross section of a sample holder, according to Embodiment 13, showing the whole structure of the holder.

In the present embodiment, a sample holder 151 is placed inside a vacuum chamber 308 (see FIG. 23). A stage 313 forming support means is mounted to move the sample holder 151. Before the sample holder 151 is placed into the vacuum chamber 308, the entrance 308a and exit 308b are sealed off.

Figure 24:
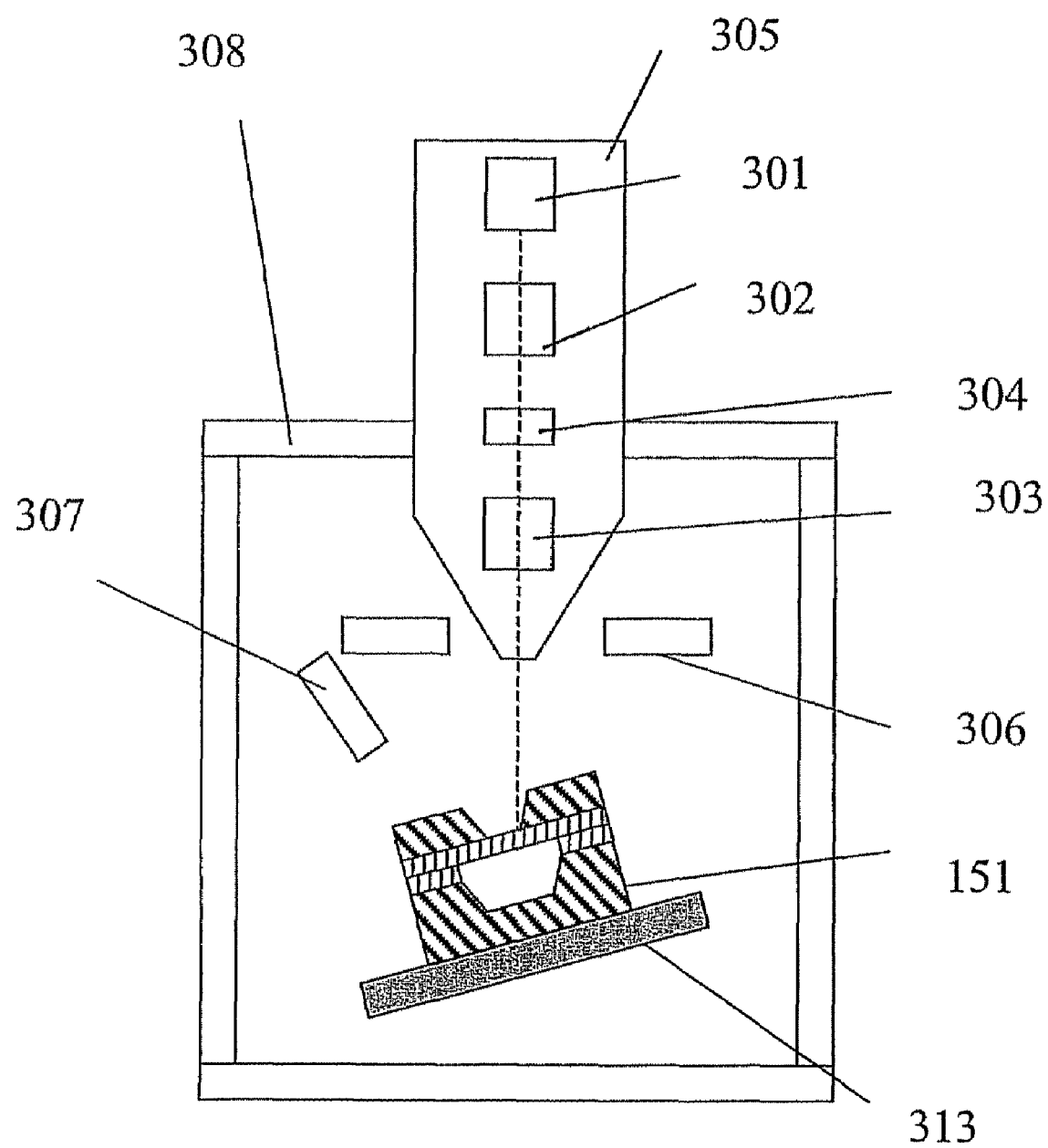
FIG. 24 is a vertical cross section similar to FIG. 23, but in which the stage has been tilted.

Because of this structure, the sample 315 can be easily tilted and observed or inspected (see FIG. 24).

Embodiment 14

The present embodiment is similar to Embodiment 7 except that an index pattern 180 is formed on a part of the sample holder 157 to indicate dimensional references by means of dimensional indicia.

Figure 25:
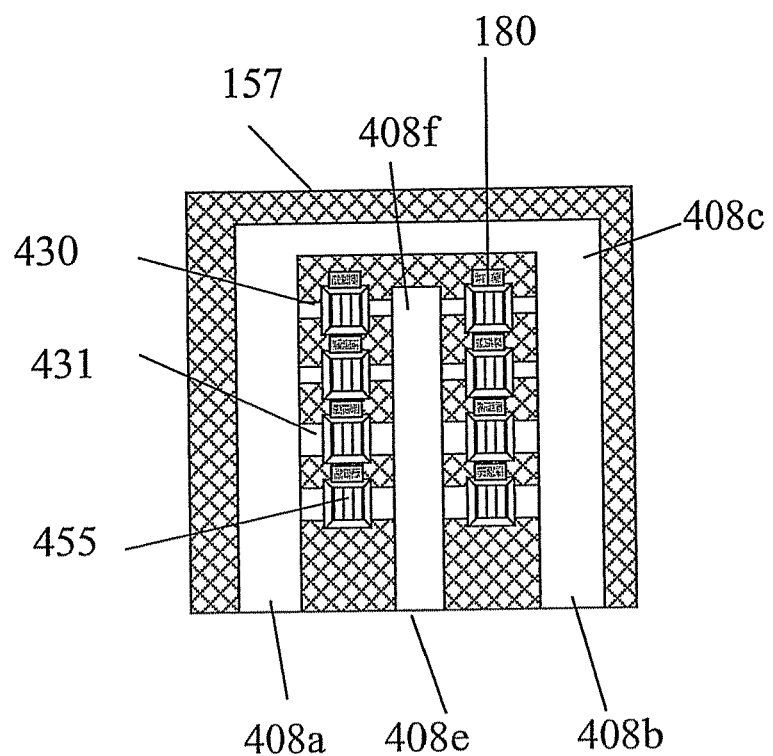
FIG. 25 is a schematic view of a sample holder, according to Embodiment 14, showing the whole structure of the holder.
Figure 26:
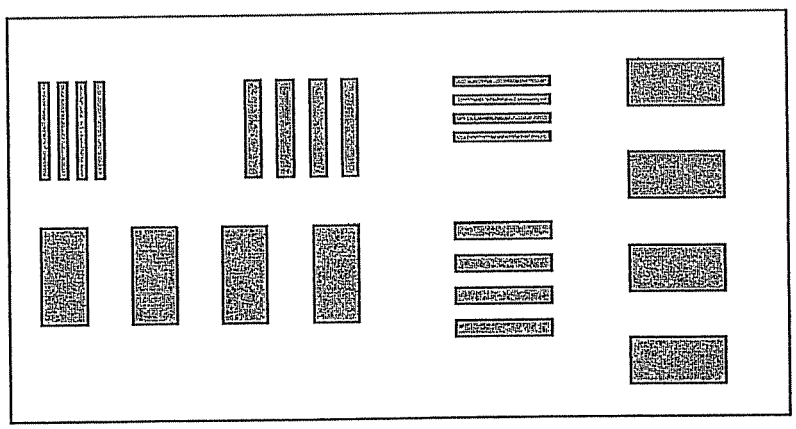
FIG. 26 is a diagram showing a reference pattern of lengths, according to Embodiment 14.

The configuration of the sample holder 157 according to the present embodiment is shown in FIG. 25. A reference pattern (index pattern) 180 providing references for lengths is formed on the surface of the sample holder 157 near each observation portion 455. An example of the reference pattern for lengths is shown in FIG. 26 and includes sets of lines having different intervals. When a sample is observed or inspected, an image of such length references is obtained and compared with images of ingredients within the sample. Consequently, the dimensions of the ingredients within the sample can be known precisely.

Embodiment 15

Figure 27:
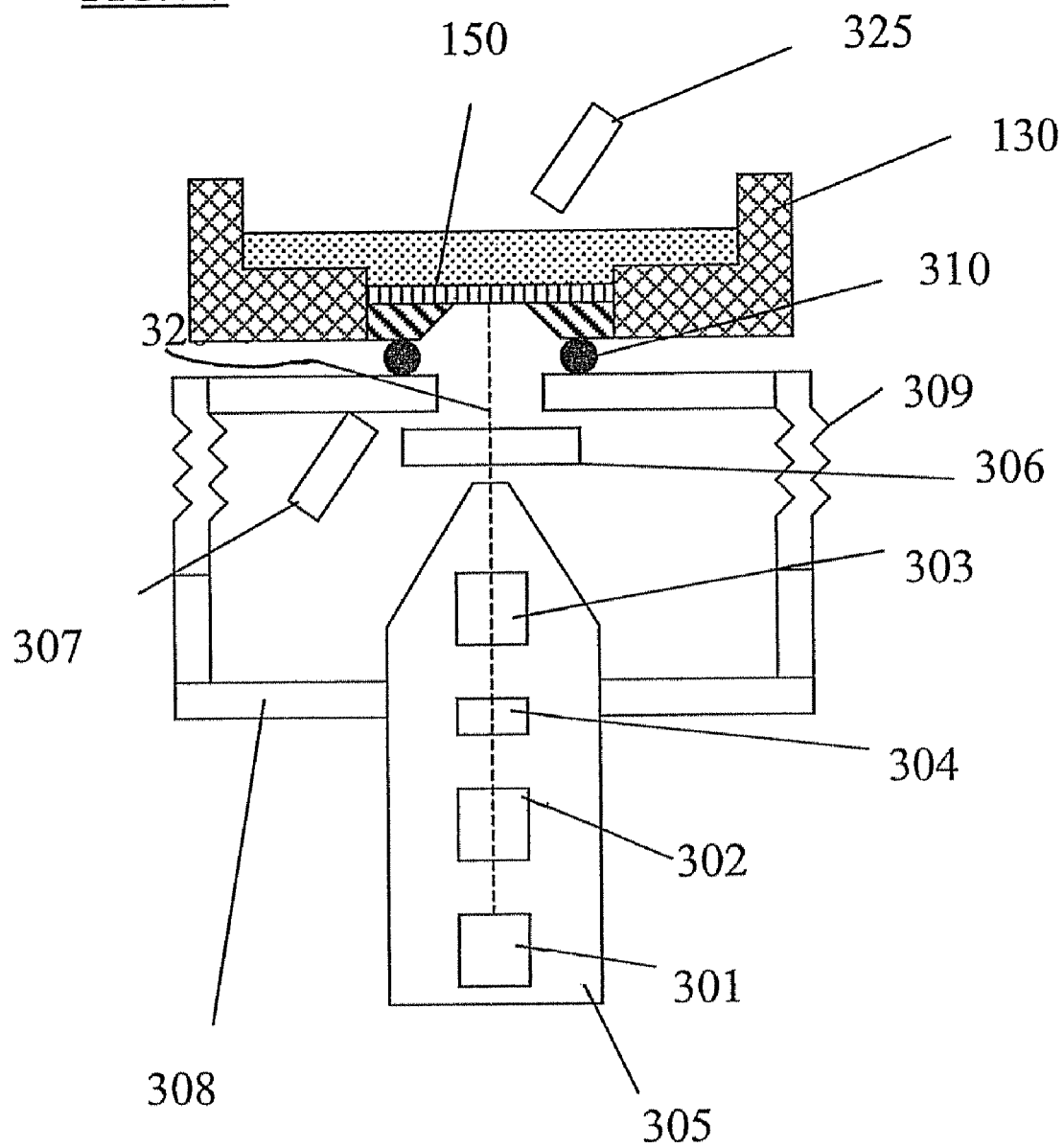
FIG. 27 is a cross-sectional view of a sample holder, according to Embodiment 15, showing the whole structure of the holder.

The present embodiment is similar to Embodiment 4 except that the sample 315 is pretreated and marked with a fluorescent marker and that a fluorescent detector 325 is added to the detector (FIG. 27). In particular, antibodies to which a fluorescent marker is attached is added to the sample by making use of an antigen-antibody reaction.

When the sample is irradiated with a focused electron beam, the fluorescent marker produces cathodoluminescent emission. The emitted light is detected by the fluorescent detector 325. In the present embodiment, when an observation or inspection is performed, backscattered or secondary electrons are first detected. The focus or stigmation of the electron beam 320 is adjusted. Then, the fluorescent spot is identified using the fluorescent detector 325.

Consequently, it is possible to know where a protein of interest or its complexes are located. Then, the fluorescent location and its vicinities can be observed or inspected in detail by detecting backscattered or secondary electrons again.

Embodiment 16

The present embodiment is similar to Embodiment 15 except that a metal marker is attached during the pretreatment. In particular, an antibody to which a gold marker has been attached is added to the sample by making use of an antigen-antibody reaction. At this time, gold particles having diameters of 10 to 50 nm are used as the marker.

When a focused electron beam is directed at the sample, the metal marker is larger in atomic weight than biological portions. Consequently, the marker can be clearly observed as a backscattered electron image. This makes it possible to know where the protein of interest or its composite are located. Furthermore, the protein or its composites and its surroundings can be observed or inspected in detail.

Embodiment 17

Figures 28A, 28B:
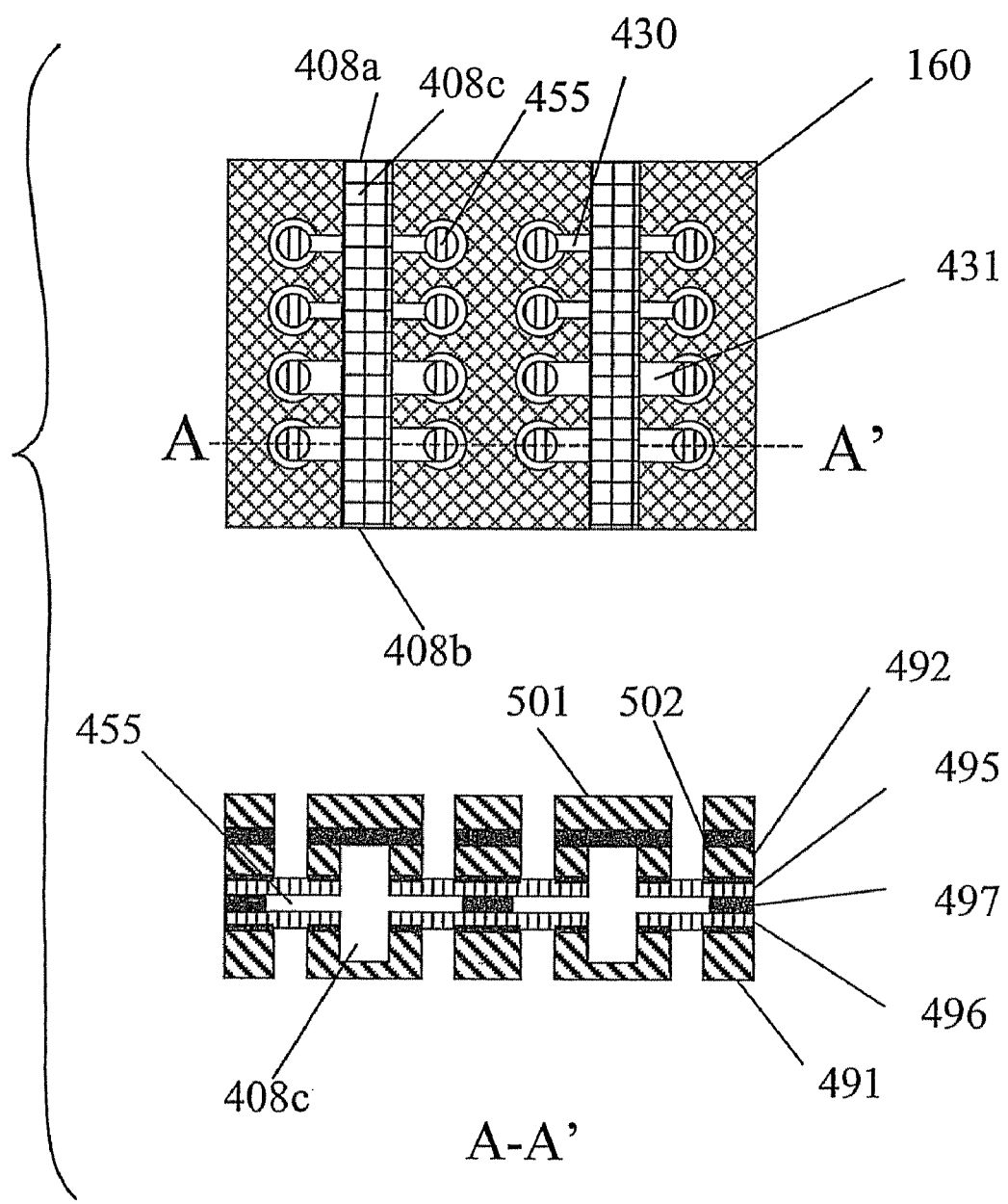
FIG. 28(*a*) shows the configuration of a sample holder, according to Embodiment 17, and FIG. 28(*b*) shows a section taken along line A-A'.

The structure of a sample holder 160 according to the present embodiment is shown in FIG. 28. FIG. 28(a) is a top plan view of the sample holder 160. FIG. 28(b) is a cross-sectional view taken on line A-A' of FIG. 28(a). The holder is provided with an entrance 408a for a sample, an exit 408b, a channel 408c, branching channels 430, 431, and observation portions 455. The sample is held in the observation portions 455. A pipe 422 for supplying the sample and another pipe 422 for discharging the sample can be connected with the entrance 408a and exit 408b, respectively, in the same way as in Embodiment 7. A channel 408c is formed between the entrance 408a and exit 408b. The sample is injected from the entrance 408a and expelled from the exit 408b through the channel 408c.

Plural channels 430 branch off from the channel 408c. The branching channels 430 and 431 are in communication with the observation portions 455. Each observation portion 455 is made of the gap between two films disposed opposite to each other, the films transmitting an electron beam (FIG. 28(b)). A sample introduced into each observation portion 455 is irradiated with the electron beam via one film. The electron beam transmitted through the sample passes through the other film and goes out of the cell. Using the observation portions 455, the sample located inside each observation portion can be observed or inspected by STEM or TEM.

Figure 29:
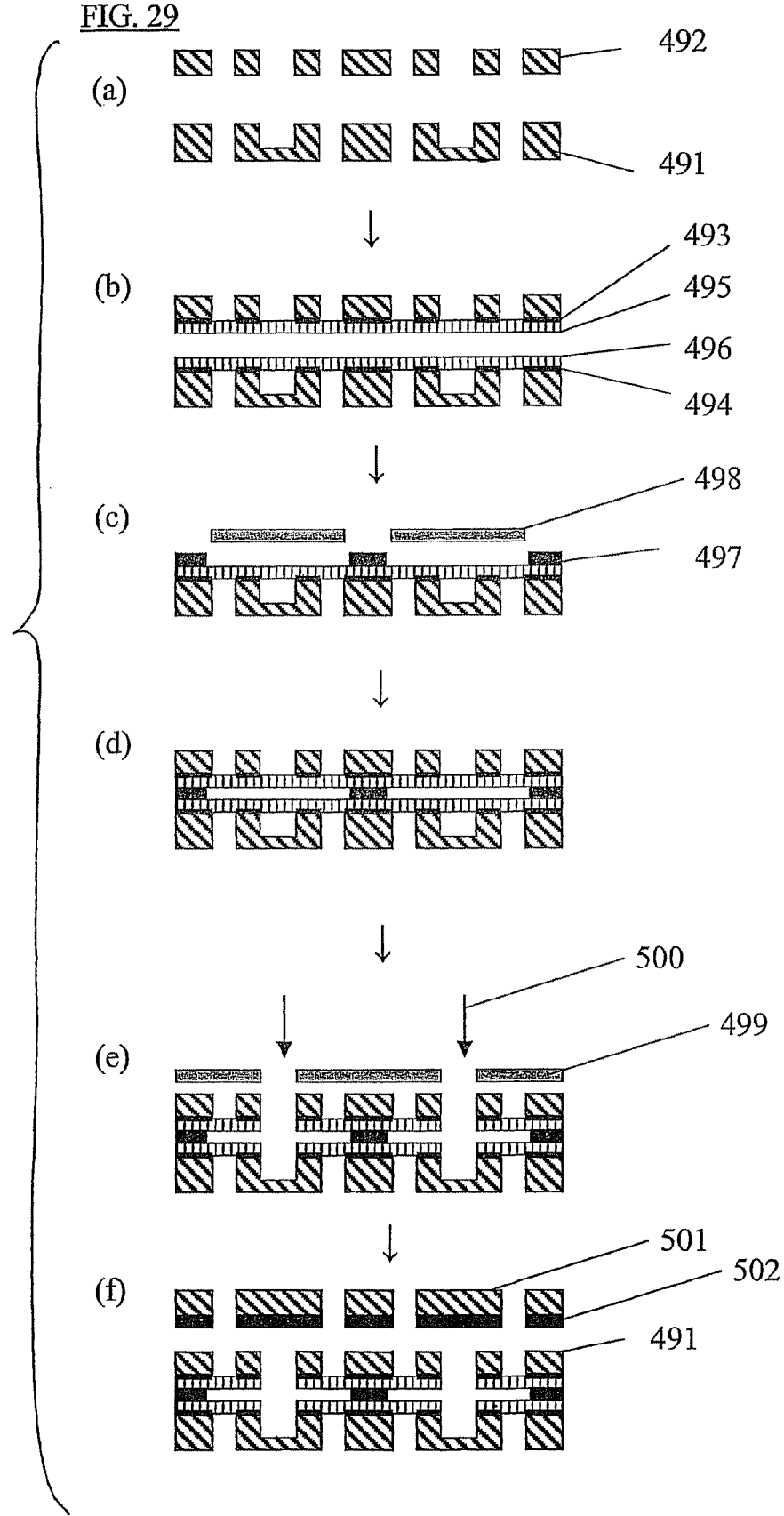
FIG. 29 shows vertical cross sections of the sample holder, according to Embodiment 17, illustrating a method of fabricating the holder.

A method of fabricating this cell is described by referring to FIG. 29. Channels, branching channels, and an observation portion are formed in each of resinous members 491 and 492 by injection molding or nanoimprint technology (FIG. 29(a)). Adhesives, 493 and 494, are sprayed on the bonded surfaces of the resinous members 491 and 492. Films 495 and 496 are bonded to the resinous members 491 and 492, respectively, adhesively (FIG. 29(b)). Adhesive 497 is applied to one film 496 to permit the two films 495 and 496 to be bonded together with a slight gap therebetween. The films 495 and 496 are then bonded together. The adhesive is applied to only the required portions using a metal mask 498 (FIG. 29(c)). The gap between the films can be adjusted by adjusting the amount of the adhesive, its viscosity, and the pressure applied when bonding is done (FIG. 29(d)). Alternatively, a spacer may be interposed between the two films 495 and 496 to adjust the gap. After performing the bonding operation, extra portions of the films are cut out. Furthermore, film portions located around the centers of the channels are removed using another metal mask 499 and an ion beam 500 (FIG. 29(e)). A portion 501 becoming a channel cap is injection-molded or formed by nanoimprint technology. Then, adhesive 502 is sprayed on the surface. The cap portion is bonded to the resinous member 491 (FIG. 29(f)). A sample holder 160 is fabricated by these steps.

Figure 30:
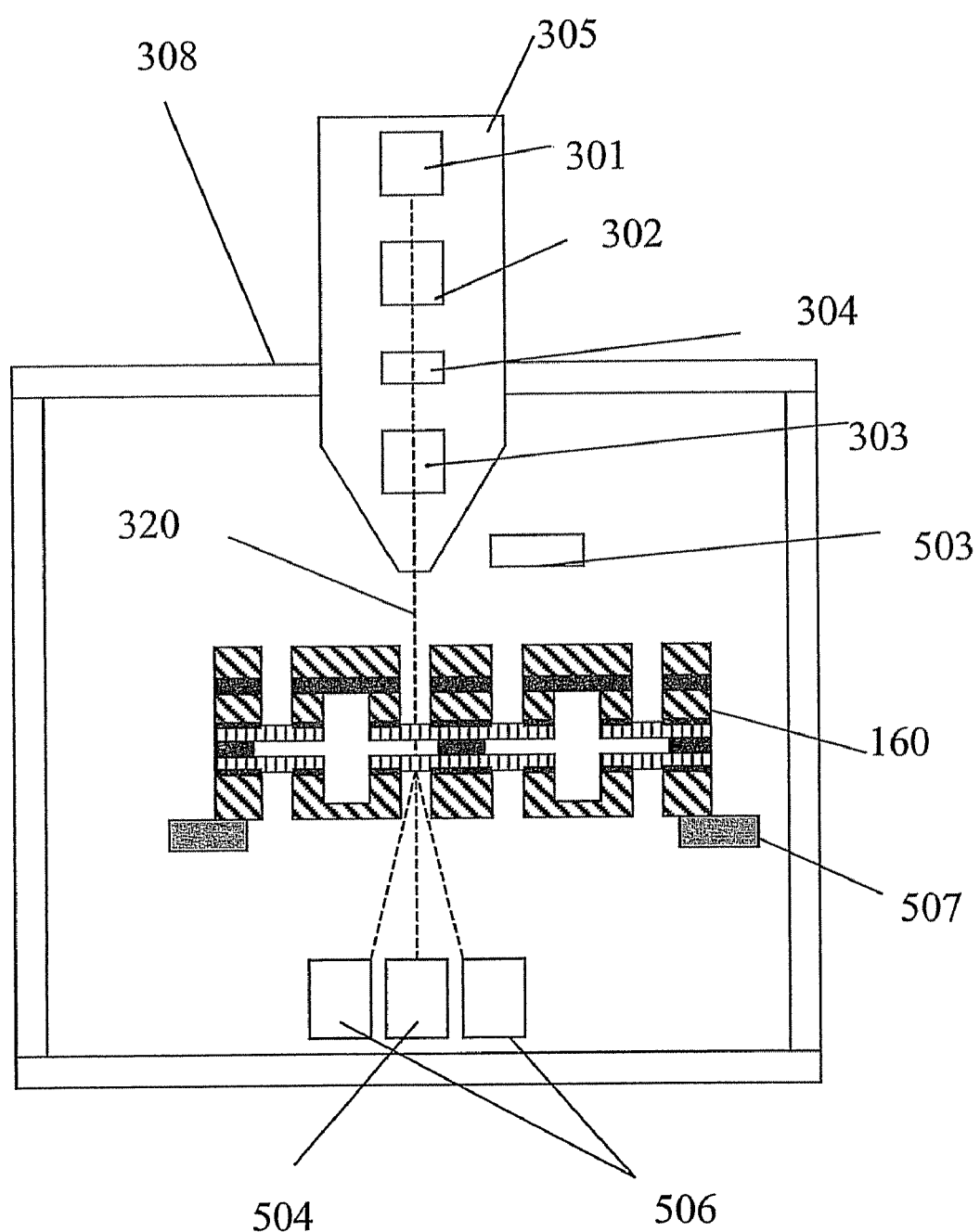
FIG. 30 is a vertical cross section of the sample holder, according to Embodiment 17, showing the whole structure of the holder.

The whole structure of an apparatus for observing or inspecting an STEM image is shown in FIG. 30. The apparatus includes an electron optics column 305, a vacuum chamber 308, an upper electron beam detector 503, an on-axis electron beam detector 504, off-axis electron beam detectors 506, a sample holder 160, and a stage 507 for supporting the sample holder 160. The stage 507 forms support means. The optics column 305 includes an electron source 301, a condenser lens 302, an objective lens 303, and a scanning unit 304.

Because of this structure, the sample inside each observation portion 455 of the sample holder 160 can be irradiated and scanned with a focused electron beam 320. Backscattered or secondary electrons induced by the electron beam 320 can be detected by the upper electron beam detector 503. Consequently, an SEM image of the sample can be obtained. At the same time, an STEM image can be derived by the use of the on-axis electron beam detector 504 and off-axis electron beam detectors 506.

A support means in which a lattice structure similar to the lattice structure of Embodiment 2 is disposed is formed to support the films 495 and 496. In this case, a thinner film can be used because the outer peripheries of the films can be reduced. As a consequence, the resolution can be improved further. In the present embodiment, an electron beam is used. An ion beam can also be used for observation. Especially, using a helium ion beam, observation can be made with less damage to the sample-holding film. In this case, an on-axis ion detector and off-axis ion detectors are used instead of the on-axis electron beam detector 504 and off-axis electron beam detectors 506, respectively.

Embodiment 18

A sample holder 161, according to the present embodiment, is similar to the sample holder of Embodiment 17 except that a delivery port 408e and a delivery channel 408f are formed in addition to the entrance 408a and exit 408b in communication with the channel 408c, in the same way as in Embodiment 9.

Figure 31:
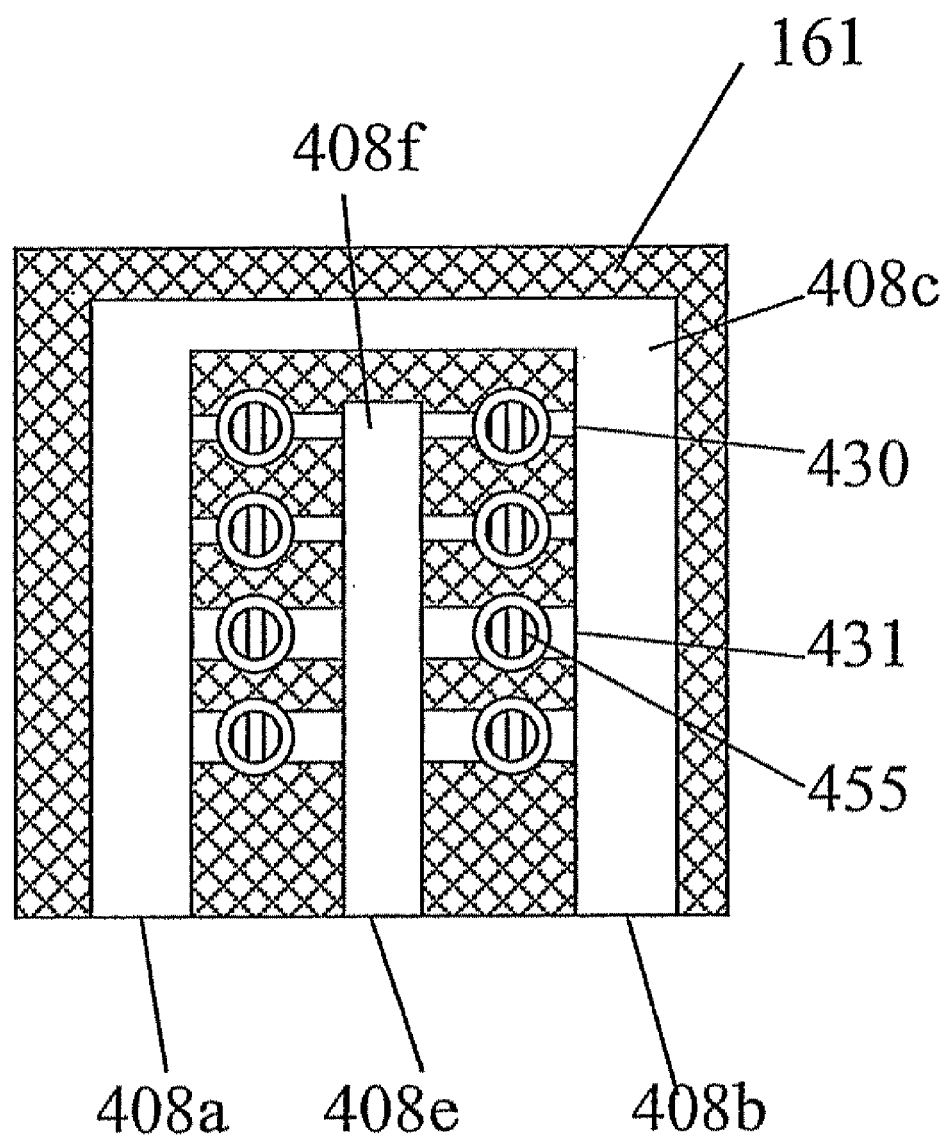
FIG. 31 is a schematic view of a sample holder, according to Embodiment 18, showing the structure of the holder.

The configuration of the present embodiment is schematically shown in FIG. 31. FIG. 31 is a top plan view of the sample holder 161. Branching channels 430 and 431 of small cross section are connected with a channel 408c extending from the entrance 408a to the exit 408b. The branching channels 430 and 431 are connected with a delivery channel 408f that is connected with the delivery port 408e through observation portions 455. A sample is entered into the channel 408c by introducing the sample toward the exit 408b from the entrance 408a. Normally, the sample enters the branching channels 430 and 431, too, by capillarity. Where the cross section of the branching channels 430 and 431 is quite small, a sufficient amount of sample may not be introduced into the observation portions 455. In contrast, in the present embodiment, a sufficient amount of sample can be entered into the observation portions 455 via the branching channels 430 and 431 by setting the pressure at the delivery port 408e lower than the pressure at the entrance 408a and exit 408b.

Because of this structure, a sample can be introduced into the observation portions 455 via the branching channels 430 and 431 of small cross section and so small ingredients can be observed and inspected.

Embodiment 19

Figure 32A:
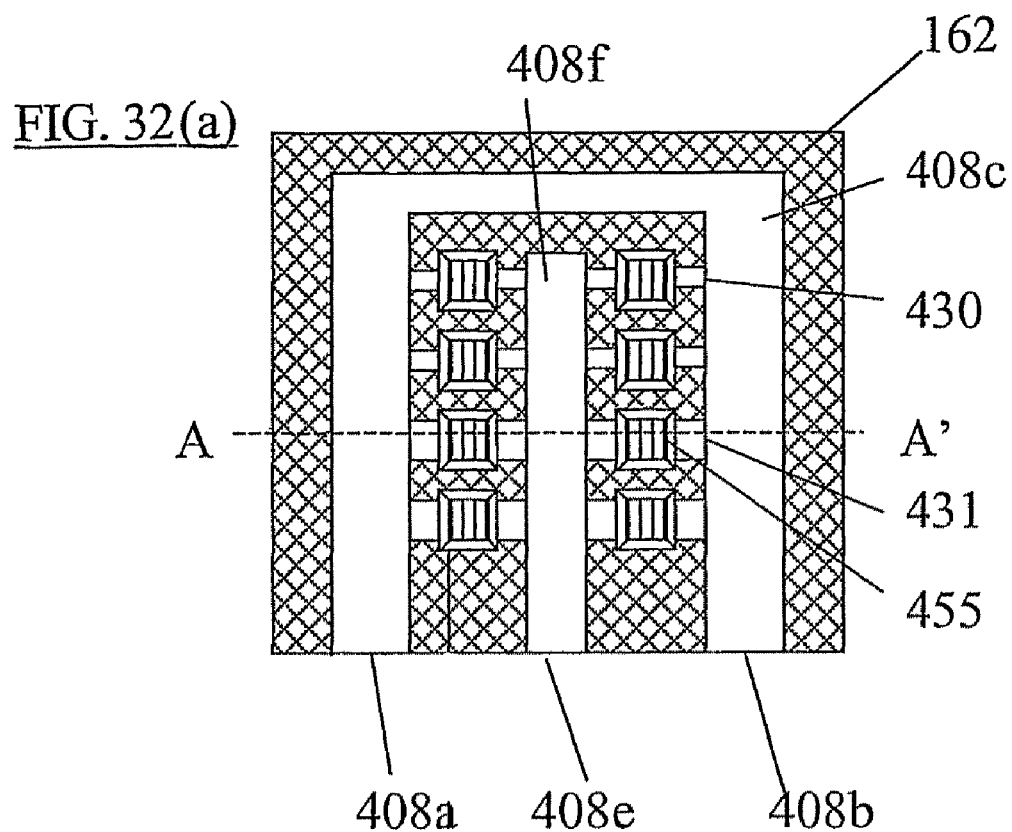
FIG. 32(*a*) shows the configuration of a sample holder, according to Embodiment 19, and FIG. 32(*b*) shows a section taken along line A-A'.
Figure 32B:
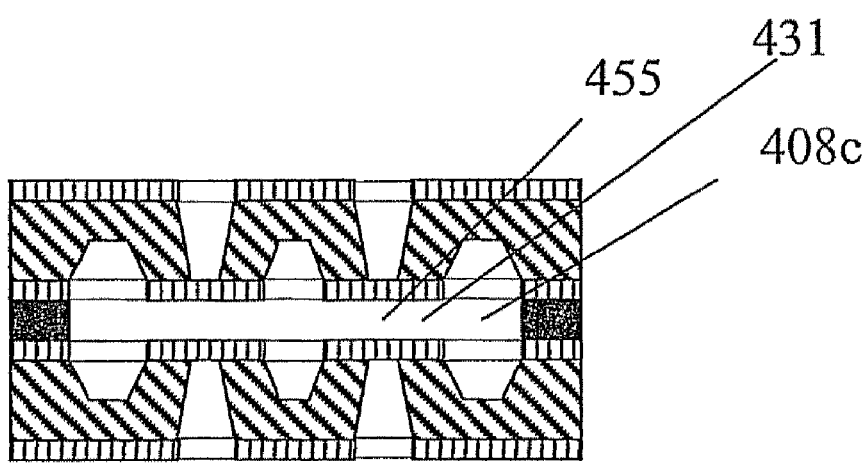

A sample holder 162, according to the present embodiment, is similar to the sample holder of Embodiment 18 except that the holder 162 is made of a silicon-based material. The holder is shown particularly in FIG. 32(a). FIG. 32(a) is a top plan view of the holder. FIG. 32(b) is a cross-sectional view taken on line A-A' of FIG. 32(a).

Figure 33:
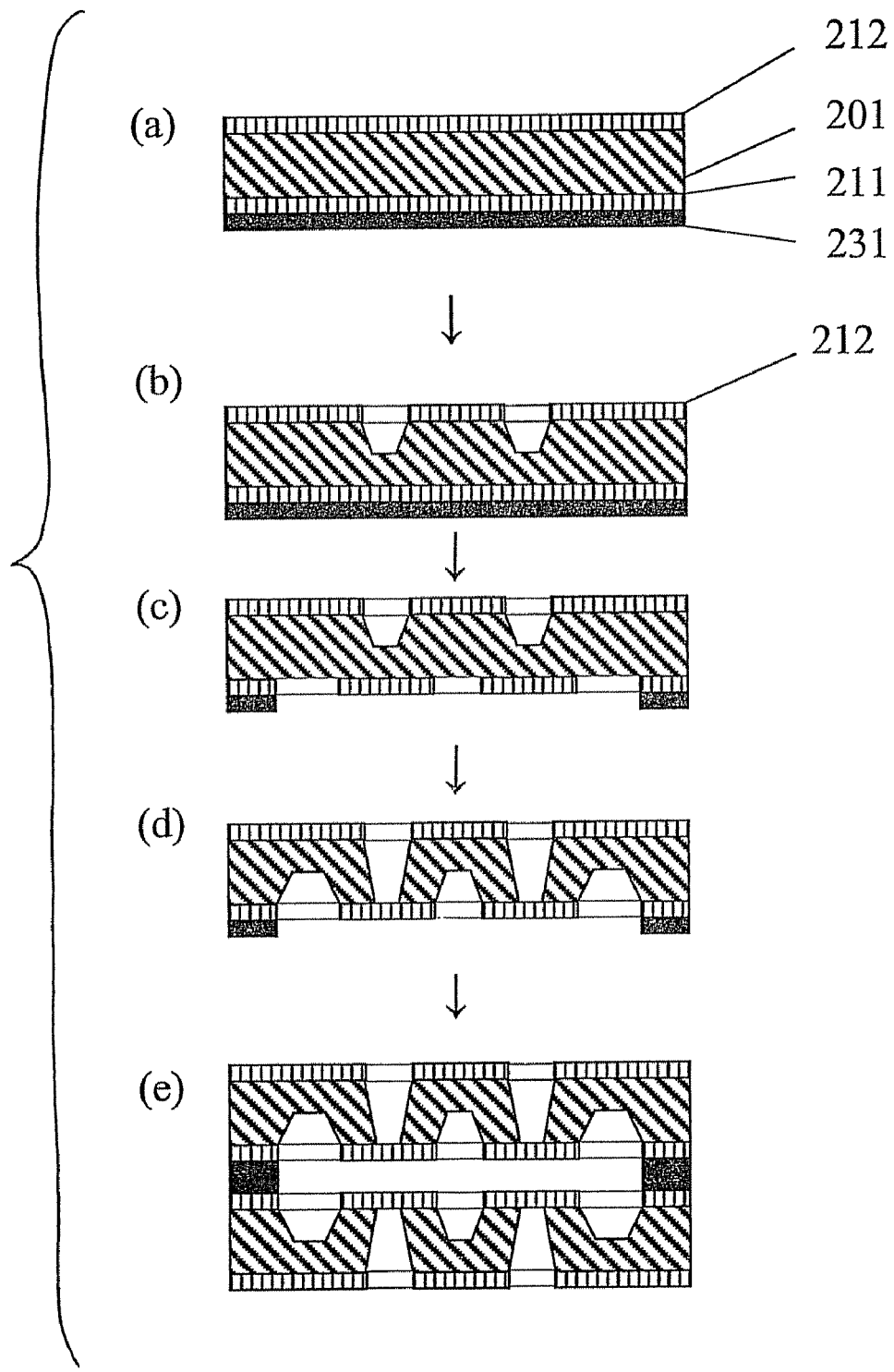
FIG. 33 shows vertical cross sections of a sample holder, according to Embodiment 19, illustrating a method of fabricating the holder.

A method of fabricating the present sample holder is described by referring to FIG. 33. Both surfaces of a silicon substrate 201 are mirror-polished. Silicon nitride films 211 and 212 are formed on both surfaces of the silicon substrate 201 by CVD. A silicon oxide film 231 is formed on one of the silicon nitride films by CVD (FIG. 33(a)). Then, the silicon nitride film 212 on which the silicon oxide film 231 is not formed is etched into a pattern on the side where only the silicon nitride film is formed by dry etching using a mask that has been lithographically formed using a photoresist. Using the pattern of silicon nitride film as a mask, the silicon substrate 201 is etched partly by wet etching using TMAH (FIG. 33(b)). Then, the silicon oxide film 231 is partially processed using a mask fabricated similarly using a photoresist lithographically. Then, the silicon nitride film 211 is etched using another mask of photoresist. As a result, a geometry as shown in FIG. 33(c) is formed. The silicon substrate 201 is etched from the surface of the silicon substrate on which any other film is not deposited and from the surface on which the silicon nitride film 231 is formed, using TMAH. As a result, a holder part as shown in FIG. 33(d) is obtained. A similar holder part is also fabricated. The two holder parts are bonded together adhesively such that their surfaces on which the silicon oxide film 231 is formed are in contact with each other. Thus, a sample holder 162 is completed (FIG. 33(e)).

The interval between the two opposite sample-holding films is adjusted to be from 1 nm to 1 μm. If the interval is greater than 1 μm, the electron beam is scattered to a greater extent by the sample-holding film. This greatly deteriorates the resolution. Where the interval is smaller than 1 nm, the sample cannot be inserted between the films. Because the sample holder is made of a silicon-based material in this way, the fabrication process can be simplified.

Embodiment 20

Figure 34:
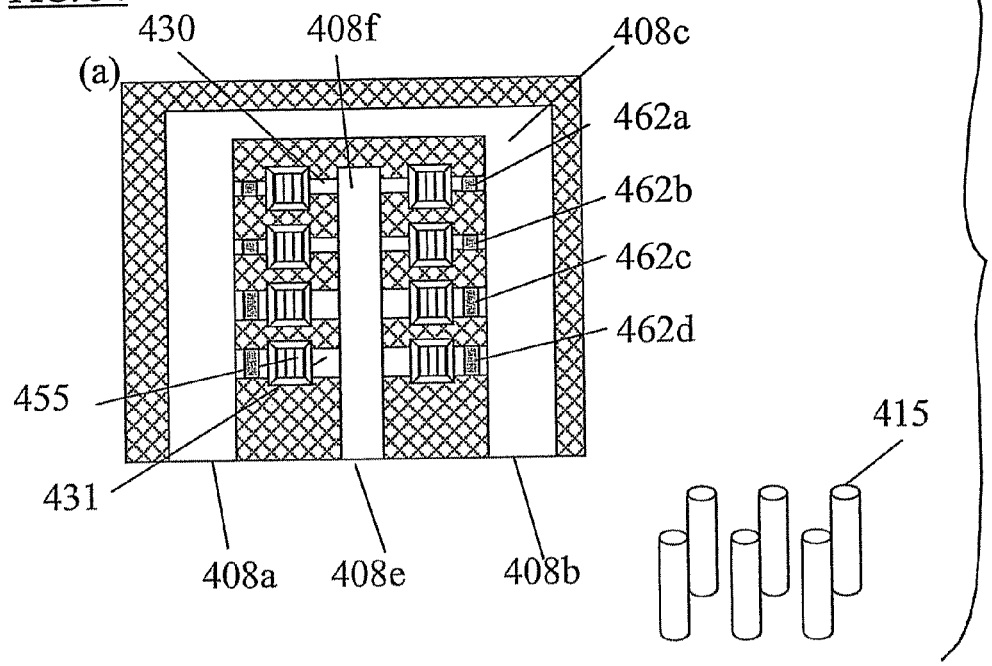
FIG. 34 shows the configuration of a sample holder, according to Embodiment 20.

The present embodiment is similar to Embodiment 19 except that filters 462a, 462b, 462c, and 462d are mounted in the branching channels 430 of small cross section connected with the channel 408c as shown in FIG. 34. Each of the filters is made of a protrusive (pillar) member 415 shown in FIG. 34. The spacing between the protrusive members is different among the filters 462a, 462b, 462c, and 462d.

Because of this configuration, sample ingredients having different sizes can be introduced to the observation portions 455. As a result, ingredients different in size can be selectively observed or inspected.

Embodiment 21

Figure 35:
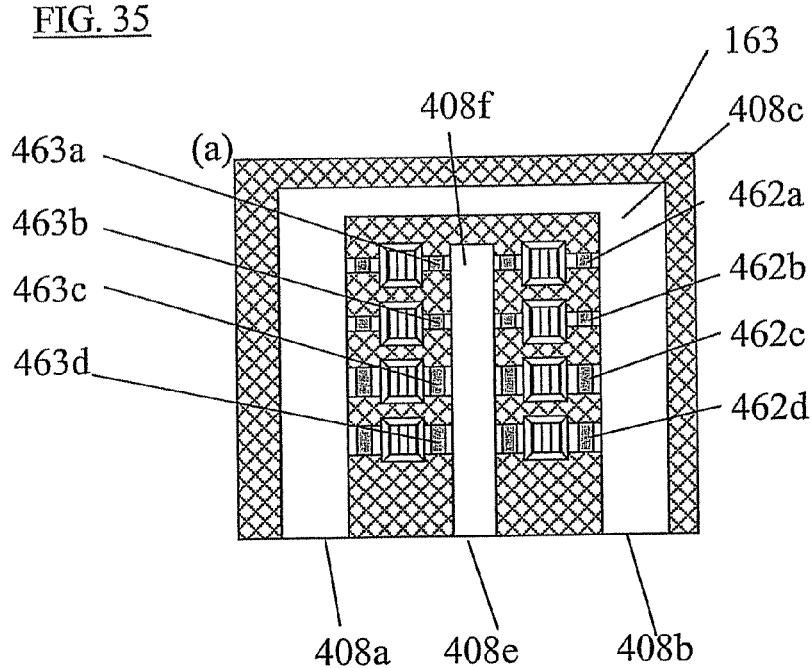
FIG. 35 shows the configuration of a sample holder, according to Embodiment 21.

A sample holder 163, according to the present embodiment, is similar to the sample holder of Embodiment 20 except that filters 463a, 463b, 463c, and 463d different from the filters 462a-462d are mounted between each observation portion 455 and delivery channel 408f (see FIG. 35). Each of the filters 463a-463d is made of a protrusive (pillar) member 415 in the same way as in Embodiment 20. In one feature of this embodiment, the spacing between the protrusive members of the filters 463a-463d is smaller than the spacing between the protrusive members of the filters 462a-462d.

The sample holder of the present embodiment operates as follows. First, a sample is introduced from the entrance 408a toward the exit 408b to fill the channel 408c with the sample, in the same way as in Embodiment 12. Then, the delivery port 408e is pumped down. The branching channels 430 in communication with the observation portions 455 are filled with the sample. At this time, the filters 462a-462d permit ingredients having different sizes to be brought into the observation portions 455.

The pressures at the entrance 408a, exit 408b, and delivery port 408e are made substantially equal. Under this condition, the sample is discharged from the exit 408b. At this time, the sample is left in the observation portions 455 but the sample is eliminated from the channel 408c. In this state, the delivery port 408e is pumped down. Consequently, only the liquid component can be discharged from the delivery port 408e through the delivery channel 408f via the filters 463a-463d. As a result, only ingredients having no liquid component can be left in the observation portions 455.

Where there is liquid inside the sample holder 163, the electron beam 320 incident on the film 411 is scattered by the liquid. In contrast, in the present embodiment, liquid is selectively discharged and only ingredients can be brought into the observation portions 455. Therefore, scattering due to liquid can be prevented. Consequently, the electron beam 320 is less scattered. Thus, observation and inspection can be performed at improved resolution.

Embodiment 22

Figure 36:
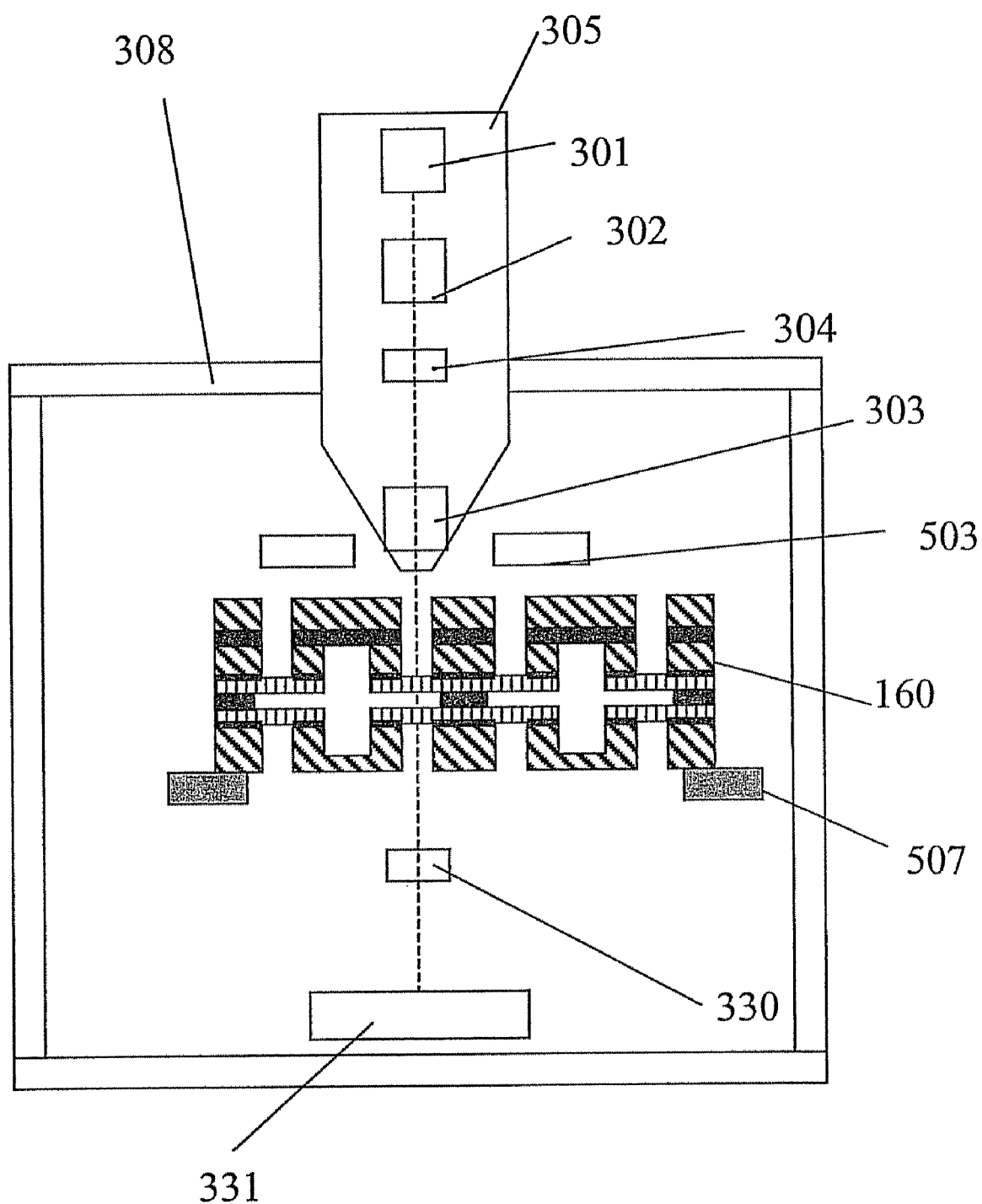
FIG. 36 is a vertical cross section of a sample holder, according to Embodiment 22, showing the whole structure of the holder.

The present embodiment is similar to Embodiment 17 except that an imaging lens 330 for focusing the electrons transmitted through the sample is added (see FIG. 36).

Because of this structure, an ordinary TEM image can be obtained. This can be easily compared with an image obtained with a normal transmission electron microscope. In FIG. 36, indicated by 331 is a high-sensitivity electron camera.

In the configuration of the present embodiment, an electron beam is used. Imaging can also be done using an ion beam. Especially, using a focused helium ion beam, observation can be made with less damage to the sample-holding film. In this case, a high-sensitivity ion camera is used instead of the high-sensitivity electron camera 331.

Embodiment 23

Figure 37:
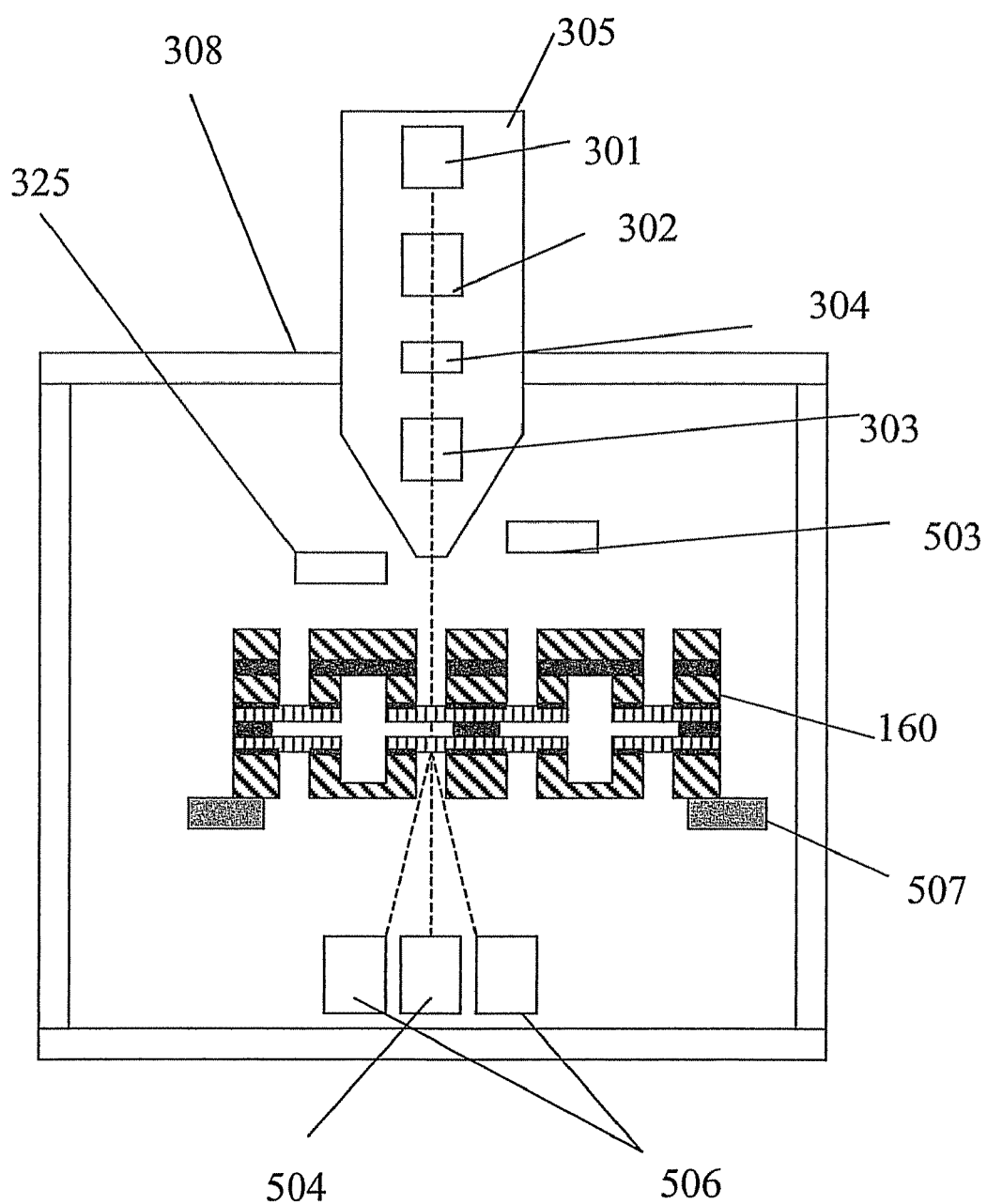
FIG. 37 is a vertical cross section of a sample holder, according to Embodiment 23, showing the whole structure of the holder.

The present embodiment is similar to Embodiment 17 except that the sample is marked with a fluorescent marker at the beginning of pretreatment and a fluorescent detector 325 is added to the detector (see FIG. 37). In particular, an antibody to which a fluorescent marker has been attached is added to the sample by making use of an antigen-antibody reaction.

When the sample is irradiated with a focused electron beam, the fluorescent marker produces cathodoluminescent emission. The emitted light is detected by the fluorescent detector 325. In the present embodiment, when an observation or inspection is performed, transmitted electrons are first detected. The focus or stigmation of the electron beam 320 is adjusted. Then, the fluorescent spot is identified using the fluorescent detector 325. Finally, a transmission electron image is obtained using a transmitted electron detector again. These steps make it possible to know what portions are fluorescing. Consequently, it is possible to identify locations of a protein of interest or its complexes. Then, the fluorescent location and its vicinities can be observed or inspected in detail by observing or inspecting transmitted electrons.

Embodiment 24

The present embodiment is similar to Embodiment 23 except that a metal marker is attached to the sample at the beginning of pretreatment. In particular, an antibody to which a gold marker has been attached is added to the sample by making use of an antigen-antibody reaction. At this time, gold particles having diameters of 10 to 50 nm are used as the marker.

When a focused electron beam is directed at the sample, the metal marker is larger in atomic weight than biological portions. Consequently, the marker can be clearly observed on a transmission electron image. Use of the marker makes it possible to identify locations where a protein of interest or its complexes are present. Furthermore, the protein or its complexes and its surroundings can be observed or inspected in detail by observing or inspecting transmitted electrons.

Embodiment 25

Figure 38:
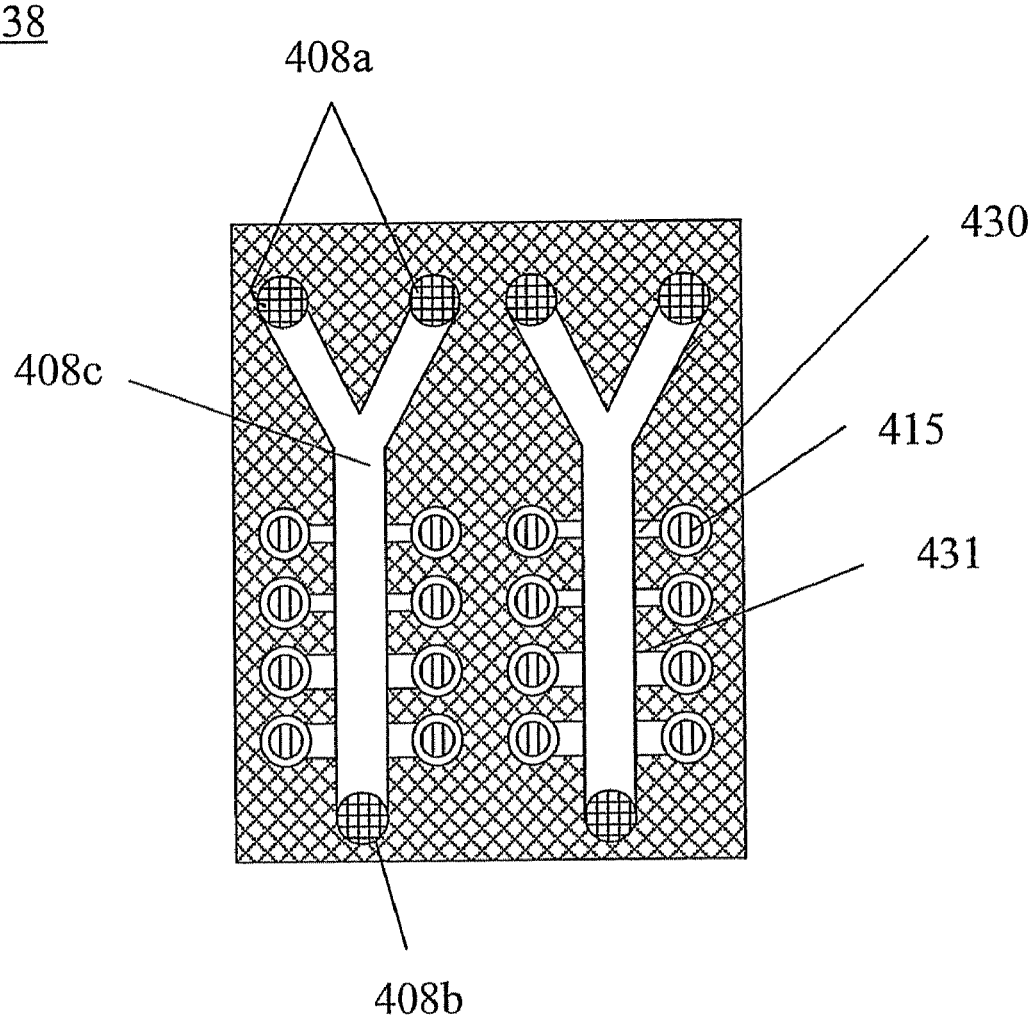
FIG. 38 is a schematic view of a sample holder, according to Embodiment 25, showing the structure of the holder.

A sample holder, according to the present embodiment, has plural entrances 408a in communication with the same channel 408c to permit a sample and a medicine to be mixed within a cell. In each channel 408c, the sample and medicine can be mixed (see FIG. 38).

Because of this structure, the sample and medicine can be mixed in a cell. The resulting mixture is introduced into a sample-holding space 415 through the observation channels 430. The surroundings of the sample-holding space 415 have a structure as described in Embodiment 5 or 17. The cell is installed in a sample chamber within a scanning electron microscope, a transmission electron microscope, or a scanning transmission electron microscope. The mixture present in the sample-holding space within the cell is irradiated with an electron beam. Produced secondary signals or transmitted electrons are detected. Thus, information about the sample can be derived.

In the present embodiment, a sample and one medicine are mixed. A configuration in which a sample and plural medicines can be mixed is also possible. The timing at which liquid medicine is mixed with a sample can be controlled by installing flow retarders in the channels.

Embodiment 26

Figure 39:
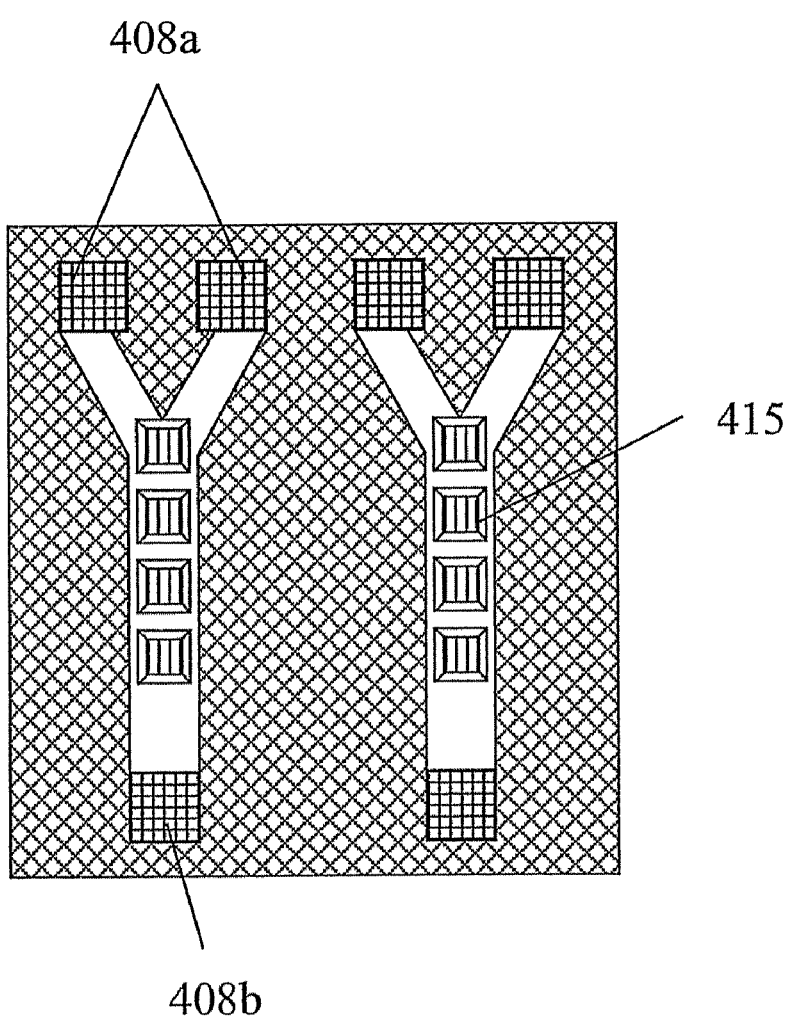
FIG. 39 is a schematic view of a sample holder, according to Embodiment 26.

The present embodiment is similar to Embodiment 25 except that the vicinities of the position where a liquid medicine and a sample are mixed can be directly observed or inspected to permit observation or inspection of the process in which the liquid medicine and sample are mixed (see FIG. 39). The whole holder is made of a silicon-based material. Because of this structure, the process in which the liquid medicine and sample react can be measured at high resolution.

In this way, in the sample holder, according to the present invention, the openings 102b and 150b in the frame-like members 102a and 150a are covered with the films 101 and 150c, respectively. The sample 315 is held on the first surface of each film. The thickness D of the film and the length L of the outer periphery of the portion of each film that covers the opening in the frame-like member satisfy a relationship given by L/D <200,000.

In the sample holder, according to the present invention, the lattice 111 is formed in each of the openings 102b and 150b in the frame-like members 102a and 150a, respectively. At least the opening portions 111b of the lattices are covered with the films 101 and 150c, respectively. In the sample holder, the sample 315 is held on the first surface of each film. The thickness D of the film and the length L of the outer periphery of the portion of each film that covers the opening portions in the lattice satisfy a relationship given by L/D <200,000.

In this case, the thickness of each film can be set between 1 nm and 100 nm. Furthermore, the thickness of each film can be set between 1 nm and 10 nm. The films can be made of silicon nitride.

In the sample holder, the first surface of each film can be made open to permit a manipulator (not shown) having a probe to make an access to the surfaces from the outside.

Two sample holder components each having the same structure as the above-described sample holder are prepared and placed opposite to each other. A sample can be held between the two sample holder components.

Any one of the above-described sample holders may be prepared as a sample holder component. The sample holder component and a base may be disposed opposite to each other. A sample-holding space may be formed between the sample holder component and the base. A channel for supplying a sample into the sample-holding space may be formed. The sample can be supplied from the outside into the sample-holding space via the channel.

In this case, a filter structure for discriminating ingredients in the sample can be mounted in at least one of the channel and sample-holding space.

Two sample holder components each of which is the above-described sample holder may be placed opposite to each other, and a sample-holding space may be formed between the sample holder components. A channel for supplying a sample into the sample-holding space may be formed. The sample may be supplied from the outside into the sample-holding space via the channel. Also, in this case, a filter structure for discriminating ingredients in the sample can be mounted in at least one of the channel and sample-holding space.

The filter structure can have a function of discriminating the ingredients in the sample according to size. Furthermore, the filter structure can have at least one of a step portion, a tilted portion, a portion having an identified width, a pillar portion, and a portion having a function of adsorbing certain ingredients in the sample.

A delivery passage for pulling out at least a part of the sample can be connected with the sample-holding space.

The space between the opposite films or the interval between the film and the base can be set within a range of 0.01 μm to 1 μm.

A method for observing or inspecting a sample, according to the present invention, consists of holding a sample on a first surface of the film of any one of the above-described sample holders and irradiating the sample with a primary beam via the second surface of the film.

In this method, the primary beam can be emitted while reducing the pressure of the ambient in contact with the second surface of the film.

The first surface of the film can be made open. This permits a manipulator (not shown) having a probe to make an access to the sample from outside of the sample holder.

The sample held on the sample holder can be irradiated with the primary beam while reducing the pressure of the outside of the sample holder. Thus, the sample can be observed or inspected.

An observation-and-inspection apparatus, according to the present invention, has support means for supporting any one of the above-described sample holders, primary beam irradiation means for irradiating a sample with a primary beam via the film of the sample holder, and signal detection means for detecting a secondary signal produced from the sample in response to the primary beam irradiation.

Another observation-and-inspection apparatus, according to the present invention, has support means for supporting any one of the above-described sample holders, a vacuum chamber for reducing the pressure of an ambient in contact with the second surface of the film of the sample holder, primary beam irradiation means connected with the vacuum chamber and irradiating a sample held on the first surface of the film with a primary beam via the film, and signal detection means for detecting a secondary signal produced from the sample in response to the primary beam irradiation.

The primary beam can be an electron beam or an ion beam. The secondary signal can be at least one kind of secondary electrons, backscattered electrons, and fluorescent light.

The observation-and-inspection apparatus, according to the present invention, has primary beam irradiation means for irradiating a sample with a primary beam via the film of the sample holder supported on the support means. A secondary signal produced from the sample in response to the primary beam irradiation or a signal transmitted through the sample is detected. As a result, information about the sample can be obtained.

The apparatus can have a vacuum chamber and primary beam irradiation means connected with the vacuum chamber. The vacuum chamber reduces the pressure of an ambient in contact with the side of the film of sample holder that is not opposite to the sample supported on the support means. The primary beam irradiation means irradiates the sample with a primary beam via the film. A secondary signal produced from the sample in response to the irradiation or a signal transmitted through the sample is detected. As a result, information about the sample can be obtained.

The primary beam can be an electron beam or an ion beam. The secondary signal can be at least one kind of secondary electrons, backscattered electrons, and fluorescent light.

Having thus described our invention with the detail and particularity required by the Patent Laws, what is desired protected by Letters Patent is set forth in the following claims.

The invention claimed is:

1. A sample holder comprising:
a frame-like member provided with an opening; and
a film providing a cover over the opening and having a first surface on which a sample is held and a second surface,
wherein the film withstands a differential pressure of at least 2 atmospheres under the condition $L/D < 200,000$, where D is the film thickness and L is the length of the outer periphery of a portion of the film that covers the opening in the frame-like member.

2. A sample holder as set forth in claim 1 further comprising:
a frame-like member provided with an opening;
a lattice formed in the opening of the frame-like member and having opening portions; and
a film providing a cover over at least the opening portions of the lattice and having a first surface on which a sample is held;
wherein the thickness D of the film and the length L of the outer periphery of a portion of the film that covers the opening portions of the lattice satisfy a relationship given by $L/D < 200,000$.

3. A sample holder as set forth in claim 1 or 2, wherein the thickness of said film is greater than 1 nm and less than 100 nm.

4. A sample holder as set forth in claim 1 or 2, wherein the thickness of said film is greater than 1 nm and less than 10 nm.

5. A sample holder as set forth in claim 1 or 2, wherein said film is made of silicon nitride.

6. A sample holder as set forth in claim 1 or 2, wherein the first surface of said film is made open to permit access from the outside.

7. A sample holder comprising:
two similar sample holder components disposed opposite to each other, each of the sample holder components being a sample holder as set forth in claim 1 or 2,
wherein a sample can be held between the sample holder components.

8. A sample holder comprising:
a sample holder component being a sample holder as set forth in claim 1 or 2;
a base disposed opposite to the sample holder component;
a sample-holding space formed between the sample holder component and the base; and
a channel for supplying a sample into the sample-holding space,
wherein the sample can be supplied into the sample-holding space from the outside via the channel.

9. A sample holder as set forth in claim 8, further comprising a filter structure for discriminating ingredients in the sample, the filter structure being mounted in at least one of the channel and the sample-holding space.

10. A sample holder comprising:
two similar sample holder components disposed opposite to each other, each of the sample holder components being a sample holder as set forth in claim 1 or 2;
a sample-holding space formed between the sample holder components; and
a channel for supplying a sample into the sample-holding space,
wherein the sample can be supplied into the sample-holding space from the outside via the channel.

11. A sample holder as set forth in claim 10, further comprising a filter structure for discriminating ingredients in the sample, the filter structure being mounted in at least one of the channel and the sample-holding space.

12. A sample holder as set forth in claim 9 or 11, wherein said filter structure has a function of discriminating ingredients in the sample according to size.

13. A sample holder as set forth in claim 9 or 11, wherein said filter structure has at least one of a step portion, a tilted portion, a portion having an identified width, a pillar portion, and a portion having a function of adsorbing certain ingredients in the sample.

14. A sample holder as set forth in any one of claims 8 to 11, wherein a delivery passage for drawing out at least a part of the sample is connected with said sample-holding space.

15. A sample holder as set forth in any one of claims 8 to 11, wherein the films disposed opposite to each other are spaced from each other by a distance or said film and said base are spaced from each other by the distance, and wherein the distance is set within a range of 0.01 μm to 1 μm.

16. A method of observing or inspecting a sample, comprising the steps of:
preparing a sample holder as set forth in claim 1; and irradiating the sample held on the first surface of the film with a primary beam via the second surface of the film, whereby observing or inspecting the sample.

17. A method of observing or inspecting a sample as set forth in claim 16, wherein the sample is irradiated with the primary beam while reducing the pressure of an ambient in contact with the second surface of the film.

18. A method of observing or inspecting a sample as set forth in claim 16 or 17, wherein the first surface of the film is made open to permit access to the sample from outside of the sample holder.

19. A method of observing or inspecting a sample, comprising the steps of:
   preparing a sample holder as set forth in claim 7;
   holding a sample on the sample holder; and
   irradiating the sample with a primary beam while reducing the pressure outside the sample holder.

20. An apparatus for observing or inspecting a sample, said apparatus comprising:
   support means for supporting a sample holder as set forth in claim 1;
   primary beam irradiation means for irradiating the sample with a primary beam via the film of the sample holder; and
   signal detection means for detecting a secondary signal produced from the sample in response to the primary beam irradiation.

21. An apparatus for observing or inspecting a sample, said apparatus comprising:
   support means for supporting a sample holder as set forth in claim 1;
   a vacuum chamber for reducing the pressure of an ambient in contact with the second surface of the film of the sample holder;
   primary beam irradiation means connected with the vacuum chamber and irradiating the sample held on the first surface of the film with a primary beam via the film; and
   signal detection means for detecting a secondary signal produced from the sample in response to the primary beam irradiation.

22. An apparatus for observing or inspecting a sample as set forth in claim 20, wherein said primary beam is an electron beam or an ion beam, and wherein said secondary signal is at least one kind of secondary electrons, backscattered electrons, and fluorescent light.

23. An apparatus for observing or inspecting a sample, said apparatus comprising:
   support means for supporting a sample holder as set forth in claim 7;
   primary beam irradiation means for irradiating the sample with a primary beam via the film of the sample holder; and
   signal detection means for detecting a secondary signal produced from the sample in response to the primary beam irradiation or a signal transmitted through the sample to thereby obtain information about the sample.

24. An apparatus for observing or inspecting a sample, said apparatus comprising:
   support means for supporting a sample holder as set forth in claim 7;
   a vacuum chamber for reducing the pressure of an ambient in contact with a side of the film of the sample holder not opposite to the sample;
   primary beam irradiation means connected with the vacuum chamber and irradiating the sample with a primary beam via the film; and
   signal detection means for detecting a secondary signal produced from the sample in response to the irradiation or a signal transmitted through the sample to thereby obtain information about the sample.

25. An apparatus for observing or inspecting a sample as set forth in claim 23 or 24, wherein said primary beam is an electron beam or an ion beam, and wherein said secondary signal is at least one kind of secondary electrons, backscattered electrons, and fluorescent light.

* * * * *